US010522689B2

(12) United States Patent
Sasaki et al.

(10) Patent No.: US 10,522,689 B2
(45) Date of Patent: Dec. 31, 2019

(54) SEMICONDUCTOR DEVICE AND METHOD OF MANUFACTURING THE SAME

(71) Applicant: Semiconductor Energy Laboratory Co., Ltd., Atsugi-shi, Kanagawa-ken (JP)

(72) Inventors: Toshinari Sasaki, Atsugi (JP); Hitomi Sato, Isehara (JP); Kosei Noda, Atsugi (JP); Yuta Endo, Atsugi (JP); Mizuho Ikarashi, Kawasaki (JP); Keitaro Imai, Yokohama (JP); Atsuo Isobe, Isehara (JP); Yutaka Okazaki, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/605,211

(22) Filed: May 25, 2017

(65) Prior Publication Data

US 2017/0271519 A1    Sep. 21, 2017

Related U.S. Application Data

(63) Continuation of application No. 14/269,819, filed on May 5, 2014, now Pat. No. 9,666,720, which is a (Continued)

(30) Foreign Application Priority Data

Jul. 27, 2010 (JP) .................................. 2010-168404

(51) Int. Cl.
*H01L 29/786* (2006.01)
*H01L 29/66* (2006.01)

(52) U.S. Cl.
CPC .... *H01L 29/7869* (2013.01); *H01L 29/66969* (2013.01); *H01L 29/78603* (2013.01); *H01L 29/78606* (2013.01)

(58) Field of Classification Search
USPC .......................................................... 257/43
See application file for complete search history.

(56) References Cited

U.S. PATENT DOCUMENTS 5,731,856 A   3/1998   Kim et al.
5,744,864 A   4/1998   Cillessen et al.
(Continued)

FOREIGN PATENT DOCUMENTS

EP   1737044 A   12/2006
EP   2120267 A   11/2009
(Continued)

OTHER PUBLICATIONS

International Search Report (Application No. PCT/JP2011/067174) dated Oct. 25, 2011.
(Continued)

*Primary Examiner* — Zandra V Smith
*Assistant Examiner* — Lawrence C Tynes, Jr.
(74) *Attorney, Agent, or Firm* — Robinson Intellectual Property Law Office; Eric J. Robinson

(57) ABSTRACT

It is an object to manufacture a semiconductor device in which a transistor including an oxide semiconductor has normally-off characteristics, small fluctuation in electric characteristics, and high reliability. First, first heat treatment is performed on a substrate, a base insulating layer is formed over the substrate, an oxide semiconductor layer is formed over the base insulating layer, and the step of performing the first heat treatment to the step of forming the oxide semiconductor layer are performed without exposure to the air. Next, after the oxide semiconductor layer is formed, second heat treatment is performed. An insulating layer from which oxygen is released by heating is used as the base insulating layer.

16 Claims, 21 Drawing Sheets

Related U.S. Application Data continuation of application No. 13/188,992, filed on Jul. 22, 2011, now Pat. No. 8,748,889.

(56) References Cited

U.S. PATENT DOCUMENTS

| | | |
|---|---|---|
| 6,294,274 B1 | 9/2001 | Kawazoe et al. |
| 6,380,558 B1 | 4/2002 | Yamazaki et al. |
| 6,563,174 B2 | 5/2003 | Kawasaki et al. |
| 6,645,826 B2 | 11/2003 | Yamazaki et al. |
| 6,727,522 B1 | 4/2004 | Kawasaki et al. |
| 7,015,505 B2 | 3/2006 | Yamazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,132,686 B2 | 11/2006 | Yamazaki et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,476,577 B2 | 1/2009 | Yamazaki et al. |
| 7,501,293 B2 | 3/2009 | Ito et al. |
| 7,554,118 B2 | 6/2009 | Kim et al. |
| 7,674,650 B2 | 3/2010 | Akimoto et al. |
| 7,732,819 B2 | 6/2010 | Akimoto et al. |
| 7,994,500 B2 | 8/2011 | Kim et al. |
| 8,143,115 B2 | 3/2012 | Omura et al. |
| 8,148,721 B2 | 4/2012 | Hayashi et al. |
| 8,164,256 B2 | 4/2012 | Sano et al. |
| 8,173,487 B2 | 5/2012 | Urayama et al. |
| 8,344,788 B2 | 1/2013 | Yamazaki et al. |
| 8,354,674 B2 | 1/2013 | Kimura |
| 8,384,076 B2 | 2/2013 | Park et al. |
| 8,541,258 B2 | 9/2013 | Kim et al. |
| 8,541,944 B2 | 9/2013 | Sano et al. |
| 8,557,641 B2 | 10/2013 | Sasaki et al. |
| 8,624,237 B2 | 1/2014 | Yamazaki et al. |
| 8,659,016 B2 | 2/2014 | Kim et al. |
| 8,936,963 B2 | 1/2015 | Ohara et al. |
| 9,082,857 B2 | 7/2015 | Yamazaki et al. |
| 9,397,194 B2 | 7/2016 | Yamazaki et al. |
| 9,905,699 B2 | 2/2018 | Hayashi et al. |
| 2001/0046027 A1 | 11/2001 | Tai et al. |
| 2002/0056838 A1 | 5/2002 | Ogawa |
| 2002/0057055 A1* | 5/2002 | Yamazaki ............ H01L 27/3244 313/506 |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0124123 A1* | 6/2005 | Itani ................ H01L 21/26533 438/300 |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0108497 A1 | 5/2007 | Shih et al. |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0202254 A1* | 8/2007 | Ganguli ............... C23C 16/18 427/252 |
| 2007/0212859 A1* | 9/2007 | Carey ............... H01L 21/26506 438/487 |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0303020 A1 | 12/2008 | Shin et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0051936 A1 | 3/2010 | Hayashi et al. |
| 2010/0051940 A1 | 3/2010 | Yamazaki et al. |
| 2010/0051949 A1* | 3/2010 | Yamazaki ........... H01L 29/4908 257/57 |
| 2010/0059746 A1* | 3/2010 | Itai .................... H01L 29/78609 257/43 |
| 2010/0065841 A1 | 3/2010 | Lee et al. |
| 2010/0065844 A1 | 3/2010 | Tokunaga |
| 2010/0092800 A1 | 4/2010 | Itagaki et al. |
| 2010/0102313 A1 | 4/2010 | Miyairi et al. |
| 2010/0109002 A1 | 5/2010 | Itagaki et al. |
| 2010/0193785 A1 | 8/2010 | Kimura |
| 2010/0233847 A1* | 9/2010 | Ohara ................ C01G 15/006 438/104 |
| 2010/0283049 A1 | 11/2010 | Sato et al. |
| 2011/0003430 A1 | 1/2011 | Yamazaki et al. |
| 2011/0068336 A1 | 3/2011 | Yamazaki et al. |
| 2011/0133196 A1 | 6/2011 | Yamazaki et al. |
| 2011/0134345 A1 | 6/2011 | Yamazaki et al. |
| 2011/0284844 A1 | 11/2011 | Endo et al. |
| 2011/0284846 A1 | 11/2011 | Endo et al. |
| 2011/0284847 A1 | 11/2011 | Endo et al. |
| 2012/0018727 A1* | 1/2012 | Endo ................ H01L 29/66742 257/57 |
| 2012/0168750 A1 | 7/2012 | Hayashi et al. |

(56) References Cited

U.S. PATENT DOCUMENTS

| | | | |
|---|---|---|---|
| 2012/0273780 A1 | 11/2012 | Yamazaki et al. | |
| 2015/0084048 A1 | 3/2015 | Hayashi et al. | |
| 2016/0268437 A1 | 9/2016 | Yamazaki et al. | |

FOREIGN PATENT DOCUMENTS

| | | | |
|---|---|---|---|
| EP | 2141744 | A | 1/2010 |
| EP | 2159845 | A | 3/2010 |
| EP | 2226847 | A | 9/2010 |
| EP | 2408011 | A | 1/2012 |
| EP | 2927965 | A | 10/2015 |
| EP | 3249694 | A | 11/2017 |
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-251705 | A | 9/1993 |
| JP | 08-264794 | A | 10/1996 |
| JP | 11-505377 | | 5/1999 |
| JP | 2000-044236 | A | 2/2000 |
| JP | 2000-150900 | A | 5/2000 |
| JP | 2002-076356 | A | 3/2002 |
| JP | 2002-289859 | A | 10/2002 |
| JP | 2003-086000 | A | 3/2003 |
| JP | 2003-086808 | A | 3/2003 |
| JP | 2003-249661 | A | 9/2003 |
| JP | 2004-103957 | A | 4/2004 |
| JP | 2004-273614 | A | 9/2004 |
| JP | 2004-273732 | A | 9/2004 |
| JP | 2005-285975 | A | 10/2005 |
| JP | 2008-166716 | A | 7/2008 |
| JP | 2009-135380 | A | 6/2009 |
| JP | 2009-141002 | A | 6/2009 |
| JP | 2009-224479 | A | 10/2009 |
| JP | 2009-278115 | A | 11/2009 |
| JP | 2009-295997 | A | 12/2009 |
| JP | 2010-016347 | A | 1/2010 |
| JP | 2010-056542 | A | 3/2010 |
| JP | 2010-062229 | A | 3/2010 |
| JP | 2010-080947 | A | 4/2010 |
| JP | 2010-080952 | A | 4/2010 |
| JP | 2010-123938 | A | 6/2010 |
| JP | 5222636 | | 6/2013 |
| KR | 2005-0113040 | A | 12/2005 |
| KR | 2009-0089450 | A | 8/2009 |
| KR | 2009-0095612 | A | 9/2009 |
| KR | 2010-0103414 | A | 9/2010 |
| WO | WO-2004/114391 | | 12/2004 |
| WO | WO-2008/069056 | | 6/2008 |
| WO | WO-2008/069255 | | 6/2008 |
| WO | WO-2008/069286 | | 6/2008 |
| WO | WO-2008/126729 | | 10/2008 |
| WO | WO-2010/047217 | | 4/2010 |

OTHER PUBLICATIONS

Written Opinion (Application No. PCT/JP2011/067174) dated Oct. 25, 2011.

Fortunato.E et al., "Wide-Bandgap High-Mobility ZnO Thin-Film Transistors Produced at Room Temperature", APPL. PHYS. LETT. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", APPL. PHYS. LETT. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", APPL. PHYS. LETT. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350°C.", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. APPL. PHYS. (Journal of Applied Physics), Feb. 1, 2003, vol. 93, No. 3, pp. 1624-1630.

Asakuma.N et al., "Crystallization and Reduction of SOL-GEL-Derived Zinc Oxide Films by Irradiation With Ultraviolet Lamp", Journal of SOL-GEL Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Nomura.K et al., "Carrier transport in transparent oxide semiconductor with intrinsic structural randomness probed using single-crystalline $InGaO_3(ZnO)_5$ films", APPL. PHYS. LETT. (Applied Physics Letters), Sep. 13, 2004, vol. 85, No. 11, pp. 1993-1995.

Li.C et al., "Modulated Structures of Homologous Compounds $InMO_3(ZnO)_m$ (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer", ADV. MATER. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", PHYS. REV. LETT. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

(56) References Cited

OTHER PUBLICATIONS

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-IN. AMOLED Display With Driver Circuit Using Amorphous In—Ga—Zn-OXide TFTs", IDW '09 : Proceedings of the 16th International Display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZnO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS", J. SOC. INF. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Ohara.H et al., "21.3:4.0 IN. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, 99. 1673-1676.

Chern.H et al., "An Analytical Model for the Above-Threshold Characteristics of polysilicon Thin-Film Transistors", IEEE Transactions on Electron Devices, Jul. 1, 1995, vol. 42, No. 7, pp. 1240-1246.

Kikuchi.H et al., "39.1;Invited Paper:Optically Isotropic NANO-Structured Liquid Crystal Composites for display Applications", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases For Display Application", SID Digest '07 : SID International Symposium Digest of Technical Papers, 2007, vol. 38, pp. 1737-1740.

Nakamura.M, "Synthesis of Homologous Compound with New Long-Period Structure", Nirim Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "SPINEL,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", PHYS. REV. A (Physical Review. A), May 1, 1984, vol. 29, No. 5, pp. 2957-2959.

Meiboom.S et al., "Theory of the Blue Phase of Cholesteric Liquid Crystals", PHYS. REV. LETT. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", PHYS. REV. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", JPN. J. APPL. PHYS. (Japanese Journal of Applied Physics) , 2006, vol. 45, No. 5B, pp. 4303-4308.

Janotti.A et al., "Native Point Defects in ZnO", PHYS. REV. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", APPL. PHYS. LETT. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies In ZnO", APPL. PHYS. LETT. (Applied Physics Letters) , 2005, vol. 87, pp. 122102-1-122102-3.

Oba.F et al., "Defect energetics in ZnO: A hybrid Hartree-Fock density functional study", PHYS. REV. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. NON-CRYST. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

(56) References Cited

OTHER PUBLICATIONS

Kim.S et al., "High-Performance oxide thin film transistors passivated by various gas plasmas", 214th ECS Meeting, 2008, No. 2317, ECS.

Clark.S et al., "First Principles Methods Using Castep", Zeitschrift fur Kristallographie, 2005, vol. 220, pp. 567-570.

Lany.S et al., "Dopability, Intrinsic Conductivity, and Nonstoichiometry of Transparent Conducting Oxides", PHYS. REV. LETT. (Physical Review Letters), Jan. 26, 2007, vol. 98, pp. 045501-1-045501-4.

Park.J et al., "Dry etching of ZnO films and plasma-induced damage to optical properties", J. VAC. SCI. TECHNOL. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. ELECTROCHEM. SOC. (Journal of the Electrochemical Society), 2008, vol. 155, No. 12, pp. H1009-H1014.

Ueno.K et al., "Field-Effect Transistor on SrTiO3 With Sputtered Ai2O3 Gate Insulator", APPL. PHYS. LETT. (Applied Physics Letters), Sep. 1, 2003, vol. 83, No. 9, pp. 1755-1757.

Korean Office Action (Application No. 2013-7004899) dated Sep. 18, 2017.

Korean Office Action (Application No. 2018-7022038) dated Oct. 24, 2018.

\* cited by examiner

SEMICONDUCTOR DEVICE AND METHOD OF MANUFACTURING THE SAME

TECHNICAL FIELD

The present invention relates to a semiconductor device and a method for manufacturing the semiconductor device.

In this specification, a semiconductor device means a general device which can function by utilizing semiconductor characteristics, and an electro-optic device, a semiconductor circuit, and an electronic device are all semiconductor devices.

BACKGROUND ART

A technique by which transistors are formed using semiconductor thin films formed over a substrate having an insulating surface has been attracting attention. Such transistors are applied to a wide range of electronic devices such as an integrated circuit (IC) or an image display device (display device). As materials of semiconductor thin films applicable to the transistors, silicon-based semiconductor materials have been widely used, but oxide semiconductors have been attracting attention as alternative materials.

For example, disclosed is a transistor whose active layer is formed using an amorphous oxide containing indium (In), gallium (Ga), and zinc (Zn) and having an electron carrier concentration of less than $10^{18}/cm^3$ (see Patent Document 1).

A transistor including an oxide semiconductor is known to have a problem of low reliability because of high possibility of fluctuation in electric characteristics, although the transistor including an oxide semiconductor can operate at higher speed than a transistor including amorphous silicon and the transistor can be manufactured more easily than a transistor including polycrystalline silicon. For example, the threshold voltage of the transistor fluctuates between before and after a bias-temperature test (BT test). Note that in this specification, a threshold voltage refers to a gate voltage which is needed to turn on the transistor. "Gate voltage" refers to a potential difference between a source and a gate when the potential of the source is used as a reference potential.

REFERENCE

[Patent Document 1] Japanese Published Patent Application No. 2006-165528
[Patent Document 2] Japanese Published Patent Application No. 2009-141002
[Patent Document 3] Japanese Published Patent Application No. 2009-295997

DISCLOSURE OF INVENTION

Fluctuation in the threshold voltage due to a BT test of the transistor including an oxide semiconductor drastically reduces the reliability of the transistor including an oxide semiconductor. An object of one embodiment of the present invention is to improve reliability of a semiconductor device including an oxide semiconductor.

Further, there is a problem in that a transistor including an oxide semiconductor tends to have normally-on characteristics and it is difficult to provide a logic circuit which operates properly in a driver circuit. Thus, an object of one embodiment of the present invention is to obtain normally-off characteristics of a transistor including an oxide semiconductor.

One embodiment of the present invention is a semiconductor device including a base insulating layer which covers a substrate and an oxide semiconductor layer provided over the base insulating layer. In the semiconductor device, the hydrogen concentration at an interface between the substrate and the base insulating layer is less than or equal to $1.1 \times 10^{20}$ atoms/cm$^3$.

Note that in the present invention, the term "hydrogen" indicates a hydrogen atom. For example, the term "containing hydrogen" includes a hydroxyl group, water, hydrocarbon, or the like as well as a hydrogen molecule.

One embodiment of the present invention is a method for manufacturing a semiconductor device in which the adverse effect of hydrogen diffused into an oxide semiconductor layer from a substrate through a base insulating layer is reduced in a transistor including an oxide semiconductor.

In some cases, charge is generated due to a bond between an oxide semiconductor layer and hydrogen. In general, when hydrogen is bonded to an oxide semiconductor, part of the bond becomes a donor and generates an electron which is a carrier. As a result, the threshold voltage of a transistor shifts negatively. According to one embodiment of the present invention, the adverse effect of hydrogen diffused from the substrate and the base insulating layer is reduced, whereby the negative shift of the threshold voltage can be reduced. This tendency occurs remarkably on the backchannel side of the oxide semiconductor layer.

Another embodiment of the present invention is a method for manufacturing a semiconductor device, in which first heat treatment is performed on a substrate; a base insulating layer is formed over the substrate; an oxide semiconductor layer is formed over the base insulating layer; and the step of performing the first heat treatment to the step of forming the oxide semiconductor layer are performed without exposure to the air.

Here, the first heat treatment is performed at a temperature at which hydrogen which is adsorbed or contained in the substrate can be eliminated. Specifically, the temperature of the first heat treatment is higher than or equal to 100° C. and lower than the strain point of the substrate, preferably higher than or equal to 300° C. and lower than or equal to 600° C. The first heat treatment is performed under an atmosphere that contains hydrogen as little as possible. The first heat treatment is preferably performed in high vacuum of less than or equal to $1 \times 10^{-4}$ Pa. Accordingly, hydrogen adsorbed on the substrate surface can be reduced efficiently.

Through the step of performing the first heat treatment to the step of forming the oxide semiconductor layer, the steps are successively performed in vacuum. By successively performing in vacuum the step of performing the first heat treatment to the step of forming the oxide semiconductor layer, contamination of the substrate surface and adsorption of hydrogen, which can occur at the time of exposure to the air, can be suppressed.

Diffusion of hydrogen into an oxide semiconductor layer in a subsequent step can be suppressed by reducing hydrogen that exists at an interface between a substrate and a base insulating layer. As a result, the negative shift of the threshold voltage of a transistor can be reduced and the reliability can be improved.

Note that in this specification, a normally-off transistor refers to an n-channel transistor whose threshold voltage is positive or a p-channel transistor whose threshold voltage is negative. In contrast, a normally-on transistor refers to an n-channel transistor whose threshold voltage is negative or a p-channel transistor whose threshold voltage is positive.

The successive vacuum refers to the state in which vacuum (a reduced pressure state, for example, less than or equal to 10 Pa, preferably less than or equal to 1 Pa) is kept between processes.

As the base insulating layer, an insulating layer from which oxygen is released by heating is used. Further, as the base insulating layer, an insulating layer whose hydrogen concentration is less than or equal to $1.1\times10^{20}$ atoms/cm$^3$ is used.

"Oxygen is released by heating" means that the released amount of oxygen which is converted to oxygen atoms is greater than or equal to $1.0\times10^{18}$ atoms/cm$^3$, preferably greater than or equal to $3.0\times10^{20}$ atoms/cm$^3$ in thermal desorption spectroscopy (TDS) analysis.

In the above structure, the insulating layer from which oxygen is released by heating may be formed using oxygen-excess silicon oxide ($SiO_x$ (X>2)). In the oxygen-excess silicon oxide ($SiO_x$ (X>2)), the number of oxygen atoms per unit volume is more than twice the number of silicon atoms per unit volume. The number of silicon atoms and the number of oxygen atoms per unit volume are measured by Rutherford backscattering spectrometry (RBS).

By supplying oxygen from the base insulating layer to the oxide semiconductor layer, an interface state between the base insulating layer and the oxide semiconductor layer can be reduced. As a result, it is possible to sufficiently suppress trapping of charge or the like, which can be generated due to the operation of a semiconductor device, or the like, at the above interface between the base insulating layer and the oxide semiconductor layer.

Further, in some cases, charge is generated due to oxygen deficiency in the oxide semiconductor layer. In general, when oxygen deficiency is caused in an oxide semiconductor layer, part of the oxygen deficiency becomes a donor and generates an electron which is a carrier. As a result, the threshold voltage of a transistor shifts negatively. This tendency occurs remarkably in oxygen deficiency caused on the backchannel side. Note that in this specification, the "back channel" means a region of the oxide semiconductor layer on the base insulating layer side. Specifically, the back channel is in a vicinity of a region which is in contact with the base insulating layer in the oxide semiconductor layer. Oxygen is sufficiently supplied from the base insulating layer to the oxide semiconductor layer, whereby oxygen deficiency in the oxide semiconductor layer which causes the negative shift of the threshold voltage can be reduced.

In other words, when oxygen deficiency is caused in the oxide semiconductor layer, it is difficult to suppress trapping of a charge at an interface between the base insulating layer and the oxide semiconductor layer. However, by providing an insulating layer from which oxygen is released by heating for the base insulating layer, the interface state between the oxide semiconductor layer and the base insulating layer and the oxygen deficiency in the oxide semiconductor layer can be reduced and the adverse effect of the trapping of a charge at the interface between the oxide semiconductor layer and the base insulating layer can be made small.

Here, in order to supply oxygen sufficiently from the base insulating layer to the oxide semiconductor layer, it is effective to perform heat treatment for a long time or perform heat treatment at a high temperature.

Thus, second heat treatment is performed after the oxide semiconductor layer is formed.

The second heat treatment is performed at a temperature at which oxygen is supplied from the base insulating layer to the oxide semiconductor layer. Specifically, the temperature of the second heat treatment is higher than or equal to 150° C. and lower than the strain point of the substrate, preferably higher than or equal to 250° C. and lower than or equal to 450° C. By the second treatment, oxygen is released from the base insulating layer, whereby the interface state between the base insulating layer and the oxide semiconductor layer and the oxygen deficiency in the oxide semiconductor layer can be reduced by the oxygen. Note that the second heat treatment may be performed at any timing as long as it is performed after the oxide semiconductor layer is formed. In addition, the second heat treatment may be performed once or plural times.

Note that by the second heat treatment, hydrogen that exists on the substrate surface diffuses into the oxide semiconductor layer through the base insulating layer. Further, the amount of hydrogen diffused tends to increase by performing the second heat treatment for a longer time or at a higher temperature. In such a case where the hydrogen concentration at the interface between the substrate and the base insulating layer is high, it is difficult to perform the second heat treatment at a temperature or within a time for supplying a sufficient amount of oxygen for reducing the interface state between the base insulating layer and the oxide semiconductor layer and the oxygen deficiency in the oxide semiconductor layer. Therefore, the hydrogen concentration at the interface between the substrate and the base insulating layer needs to be reduced in order to supply oxygen sufficiently from the base insulating layer to the oxide semiconductor layer by heating.

In such a manner, one embodiment of the present invention is to reduce the hydrogen concentration at the interface between the substrate and the base insulating layer and to supply a sufficient amount of oxygen from the base insulating layer to the oxide semiconductor layer.

Note that the base insulating layer from which oxygen is released by heating preferably has an enough thickness with respect to the thickness of the oxide semiconductor layer. This is because when the thickness of the base insulating layer from which oxygen is released by heating is small with respect to the thickness of the oxide semiconductor layer, oxygen is not sufficiently supplied to the oxide semiconductor layer in some cases. Alternatively, this is because the adverse effect caused by diffusion of hydrogen from the substrate surface becomes large when the base insulating layer does not have a sufficient thickness with respect to the thickness of the oxide semiconductor layer.

For example, the base insulating layer can be formed using silicon oxide, silicon oxynitride, silicon nitride oxide, aluminum oxide, or a stacked layer including any of these.

In this specification, silicon oxynitride refers to a substance that contains more oxygen than nitrogen and for example, silicon oxynitride includes oxygen, nitrogen, silicon, and hydrogen at concentrations ranging from greater than or equal to 50 atomic % and less than or equal to 70 atomic %, greater than or equal to 0.5 atomic % and less than or equal to 15 atomic %, greater than or equal to 25 atomic % and less than or equal to 35 atomic %, and greater than or equal to 0 atomic % and less than or equal to 10 atomic %, respectively. Further, silicon nitride oxide refers to a substance that contains more nitrogen than oxygen and for example, silicon nitride oxide includes oxygen, nitrogen, silicon, and hydrogen at concentrations ranging from greater than or equal to 5 atomic % and less than or equal to 30 atomic %, greater than or equal to 20 atomic % and less than or equal to 55 atomic %, greater than or equal to 25 atomic % and less than or equal to 35 atomic %, and greater than or equal to 10 atomic % and less than or equal to 25 atomic %, respectively. Note that rates of oxygen, nitrogen, silicon, and hydrogen fall within the above ranges in the cases where measurement is performed using Rutherford backscattering spectrometry or hydrogen forward scattering spectrometry (HFS). In addition, the total of the percentages of the constituent elements does not exceed 100 atomic %.

As described above, a transistor having normally-off characteristics and high reliability can be obtained in such a manner that hydrogen that exists at the interface between the substrate and the base insulating layer is prevented from being diffused into the oxide semiconductor layer, and oxygen deficiency in the oxide semiconductor layer is reduced with oxygen supplied from the base insulating layer.

According to one embodiment of the present invention, a highly reliable transistor including an oxide semiconductor can be provided.

Further, according to another embodiment of the present invention, in a transistor including an oxide semiconductor, fluctuation in the threshold voltage can be suppressed, normally-off characteristics are obtained, and a current value between a source and a drain in the case where a gate voltage is not applied can be made small.

Further, according to another embodiment of the present invention, a leakage current between a source and a drain is reduced when a gate voltage of a transistor in a semiconductor device is 0 V; thus, a semiconductor device with low power consumption can be provided.

BEST MODE FOR CARRYING OUT THE INVENTION

Figure 1A:
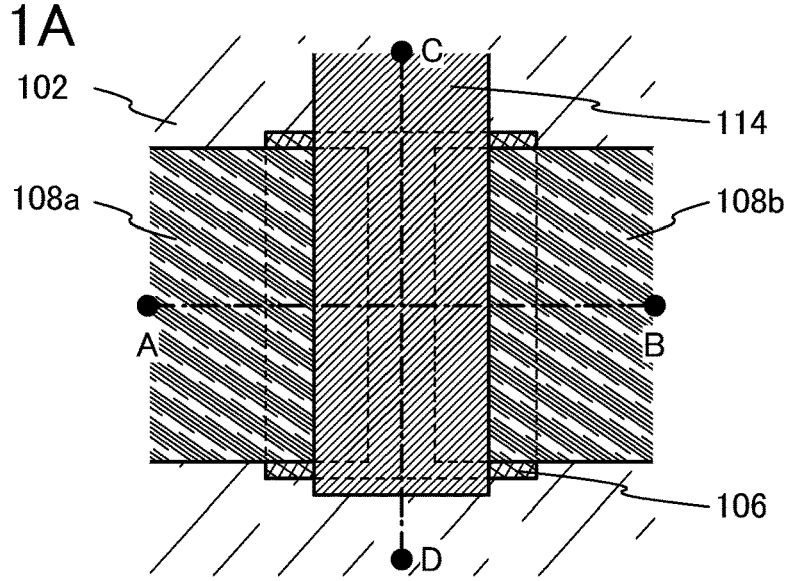
FIGS. 1A to 1C are a top view and cross-sectional views showing an example of a semiconductor device which is one embodiment of the present invention.

Embodiments of the present invention will be described below in detail with reference to the accompanying drawings. However, the present invention is not limited to the description below and it is easily understood by those skilled in the art that the mode and details can be changed variously. Therefore, the present invention is not construed as being limited to description of the embodiments. In describing structures of the present invention with reference to the drawings, the same reference numerals are used in common for the same portions in different drawings. Note that the same hatch pattern is applied to similar parts, and the similar parts are not especially denoted by reference numerals in some cases.

Note that the ordinal numbers such as "first" and "second" in this specification are used for convenience and do not denote the order of steps or the stacking order of layers. In addition, the ordinal numbers in this specification do not denote particular names which specify the present invention.

Embodiment 1

In this embodiment, one mode of a semiconductor device and a method for manufacturing the semiconductor device, which is one embodiment of the present invention, will be described with reference to FIGS. 1A to 1C, FIGS. 2A to 2C, FIGS. 3A to 3C, FIGS. 4A to 4E, FIGS. 5A to 5E, and FIGS. 6A to 6E.

Figure 1B:
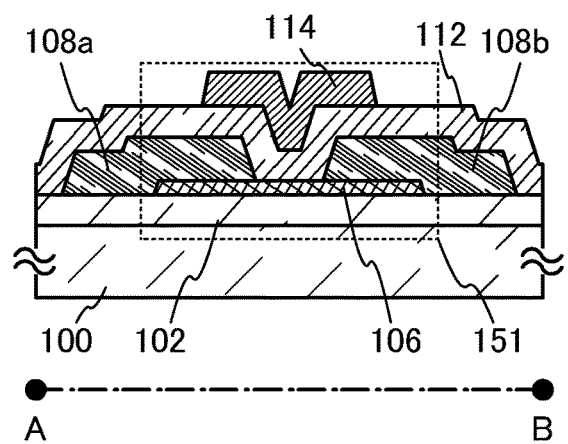
Figure 1C:
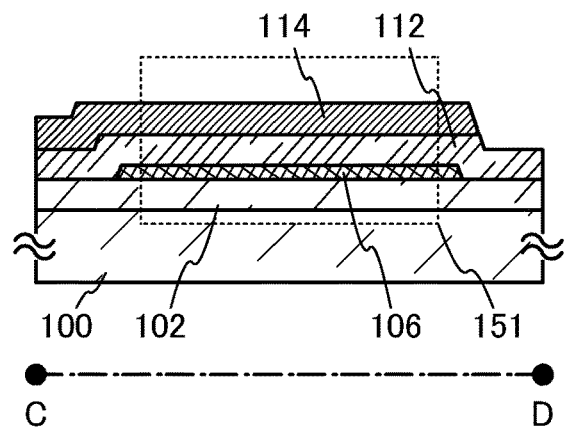

FIGS. 1A to 1C are a top view and cross-sectional views of a transistor 151 which is a top-gate top-contact type as an example of a semiconductor device according to one embodiment of the present invention. Here, FIG. 1A is a top view, FIG. 1B is a cross-sectional view taken along A-B of FIG. 1A, and FIG. 1C is a cross-sectional view taken along C-D of FIG. 1A. Note that in FIG. 1A, some of components of the transistor 151 (e.g., a gate insulating layer 112) are omitted for brevity.

The transistor 151 illustrated in FIGS. 1A to 1C includes a substrate 100, a base insulating layer 102 over the substrate 100, an oxide semiconductor layer 106 over the base insulating layer 102, a pair of a source electrode 108a and a drain electrode 108b provided over the oxide semiconductor layer 106, a gate insulating layer 112 which covers the pair of the source electrode 108a and drain electrode 108b and partly in contact with the oxide semiconductor layer 106, and a gate electrode 114 provided over the oxide semiconductor layer 106 with the gate insulating layer 112 interposed therebetween.

The base insulating layer 102 may be formed to have a single-layer structure or a stacked-layer structure using at least any of silicon oxide, silicon oxynitride, silicon nitride oxide, and aluminum oxide, for example. When the base insulating layer 102 has a stacked-layer structure of a silicon nitride layer and a silicon oxide layer, entry of moisture from the substrate or the like to the transistor 151 can be prevented. Note that the base insulating layer 102 functions as a base layer of the transistor 151. Note that an insulating layer from which oxygen is released by heating is preferably used as the base insulating layer 102 which is in contact with the oxide semiconductor layer.

For example, silicon oxide ($SiO_x$ (X>2)) in which the number of oxygen atoms per unit volume is more than twice the number of silicon atoms per unit volume may be used as a material of the base insulating layer 102.

At this time, the hydrogen concentration at an interface between the substrate and the base insulating layer is less than or equal to $1.1 \times 10^{20}$ atoms/cm$^3$. When the hydrogen concentration at the interface between the substrate and the base insulating layer is less than or equal to $1.1 \times 10^{20}$ atoms/cm$^3$, the adverse effect of hydrogen at the interface between the substrate and the base insulating layer, which is diffused into the oxide semiconductor layer, can be reduced. As a result, the negative shift of the threshold voltage of the transistor can be reduced and the reliability can be improved.

As a material used for the oxide semiconductor layer 106, an In—Sn—Ga—Zn—O-based material which is a four-component metal oxide; an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material which are three-component metal oxides; an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material which are two-component metal oxides; an In—O-based material; a Sn—O-based material; a Zn—O-based material; or the like may be used. Further, silicon oxide may be contained in the above materials. Here, for example, an In—Ga—Zn—O-based material means an oxide layer containing indium (In), gallium (Ga), and zinc (Zn), and there is no particular limitation on the composition ratio. Further, the In—Ga—Zn—O-based oxide semiconductor may contain an element other than In, Ga, and Zn.

In the case where an In—Zn—O-based material is used for the oxide semiconductor layer 106, any of the following is employed: In/Zn is greater than or equal to 0.5 and less than or equal to 50 in an atomic ratio, preferably In/Zn is greater than or equal to 1 and less than or equal to 20 in an atomic ratio, or more preferably In/Zn is greater than or equal to 1.5 and less than or equal to 15 in an atomic ratio. When the atomic ratio of Zn is in the above range, the field effect mobility of the transistor can be improved. Here, when the atomic ratio of the compound is In:Zn:O=X:Y:Z, it is preferable to satisfy the relation of Z>1.5X+Y.

For the oxide semiconductor layer 106, a thin film using a material represented by the chemical formula, $InMO_3(ZnO)_m$ (m>0), is formed. Here, M represents one or more metal elements selected from Ga, Al, Mn, and Co. For example, M may be Ga, Ga and Al, Ga and Mn, Ga and Co, or the like.

Further, concentrations of an alkali metal and an alkaline earth metal in the oxide semiconductor layer 106 is preferably less than or equal to $2 \times 10^{16}$ atoms/cm$^3$ or less than or equal to $1 \times 10^{18}$ atoms/cm$^3$. When an alkali metal and an alkaline earth metal are bonded to an oxide semiconductor, part of the bond generates a carrier, which causes the threshold voltage to shift negatively.

Furthermore, the interface state between the base insulating layer 102 and the oxide semiconductor layer 106 and the oxygen deficiency in the oxide semiconductor layer 106 can be reduced when the oxide semiconductor layer is in contact with the base insulating layer. By the above reduction in the interface state, the fluctuation in the threshold voltage after a BT test can be reduced. The amount of negative shift of the threshold voltage is reduced due to the reduction of the oxygen deficiency; thus, normally-off characteristics can be obtained.

As a conductive layer used for the source electrode 108a and drain electrode 108b, for example, a metal layer containing an element selected from Al, Cr, Cu, Ta, Ti, Mo, and W, or a metal nitride layer containing any of the above elements as its component (e.g., a titanium nitride layer, a molybdenum nitride layer, or a tungsten nitride layer) is used. A high melting point metal layer of Ti, Mo, W, or the like or a metal nitride layer of any of these elements (e.g., a titanium nitride layer, a molybdenum nitride layer, or a tungsten nitride layer) may be stacked on one of or both a bottom side and a top side of a metal layer of Al, Cu, or the like. Note that in this specification, the terms "source electrode" and "drain electrode" are names adopted for convenience in the operation of a transistor without particular distinction between a source electrode and a drain electrode.

Alternatively, the conductive layer used for the source electrode 108a and drain electrode 108b may be formed using a conductive metal oxide. As the conductive metal oxide, an indium oxide ($In_2O_3$ or the like), a tin oxide ($SnO_2$ or the like), a zinc oxide (ZnO or the like), an indium oxide-tin oxide alloy ($In_2O_3$—$SnO_2$ or the like, which is abbreviated to ITO), an indium oxide-zinc oxide alloy ($In_2O_3$—ZnO or the like), or any of these metal oxide materials containing a silicon oxide is used.

Here, between the source electrode 108a and drain electrode 108b and the oxide semiconductor layer 106, a conductive layer, the resistance of which is higher than that of the source electrode 108a and the drain electrode 108b and lower than that of the oxide semiconductor layer 106, may be provided. The conductive layer is formed using a material that can reduce contact resistance between the source electrode 108a and drain electrode 108b and the oxide semiconductor layer 106. Alternatively, a material which hardly extracts oxygen from the oxide semiconductor layer is used for the conductive layer. By providing the conductive layer, low resistance of the oxide semiconductor layer 106 which is caused by oxygen extracted from the oxide semiconductor layer 106 can be suppressed and an increase of contact resistance which is caused by formation of an oxide of the source electrode 108a and the drain electrode 108b can be suppressed. In the case where a material which hardly extracts oxygen from the oxide semiconductor layer is used for the source electrode 108a and the drain electrode 108b, the above conductive layer may be omitted.

The gate insulating layer 112 can have a structure similar to that of the base insulating layer 102, and is preferably an insulating layer from which oxygen is released by heating. At this time, a material having a high dielectric constant, such as yttria-stabilized zirconia, hafnium oxide, or aluminum oxide, may be used for the gate insulating layer 112 in consideration of the function of the gate insulating layer of the transistor. Alternatively, a stacked layer of silicon oxide, silicon oxynitride, or silicon nitride and a material having a high dielectric constant, such as yttria-stabilized zirconia, hafnium oxide, or aluminum oxide, may be used in consideration of a gate withstand voltage and a condition of an interface between the oxide semiconductor layer and the gate insulating layer 112, or the like.

The gate electrode 114 can be formed using, for example, a metal material such as molybdenum, titanium, tantalum, tungsten, aluminum, copper, neodymium, or scandium, nitride of any of these metal materials, or an alloy material which contains any of these metal materials as its main component. Note that the gate electrode 114 may have a single-layer structure or a stacked-layer structure.

A protective insulating layer or a wiring may further be provided over the transistor 151. The protective insulating layer may have a structure similar to that of the base insulating layer 102. In order to electrically connect the source electrode 108a or the drain electrode 108b and a wiring, an opening may be formed in the base insulating layer 102, the gate insulating layer 112, and the like. A second gate electrode may further be provided below the oxide semiconductor layer 106. Note that it is not always necessary but preferable to process the oxide semiconductor layer 106 into an island shape.

Figure 2A:
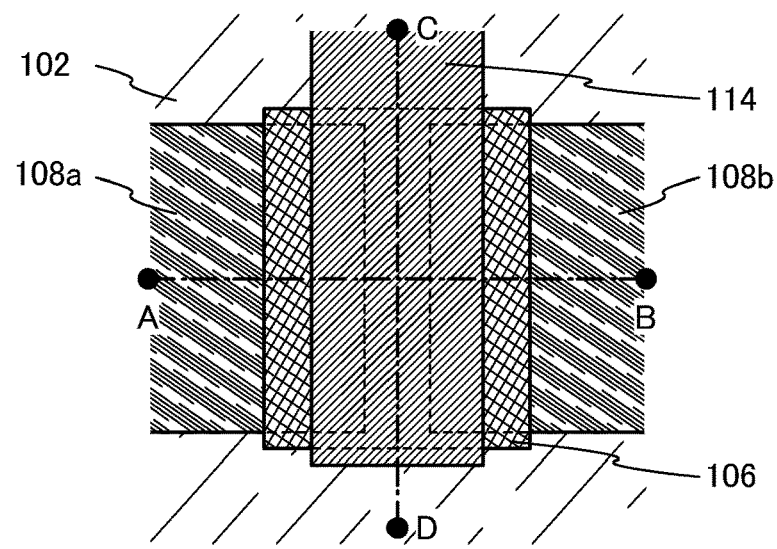
FIGS. 2A to 2C are a top view and cross-sectional views showing an example of a semiconductor device which is one embodiment of the present invention.
Figure 2B:
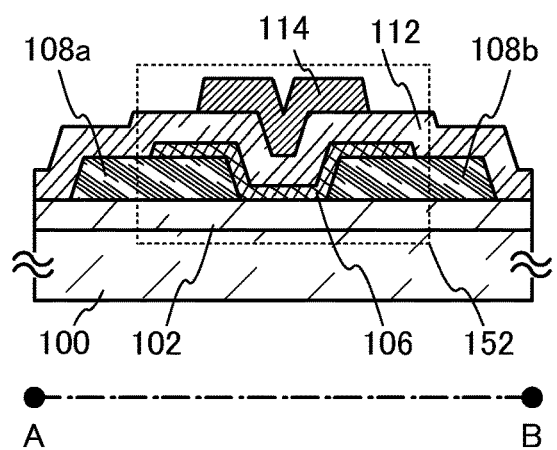
Figure 2C:
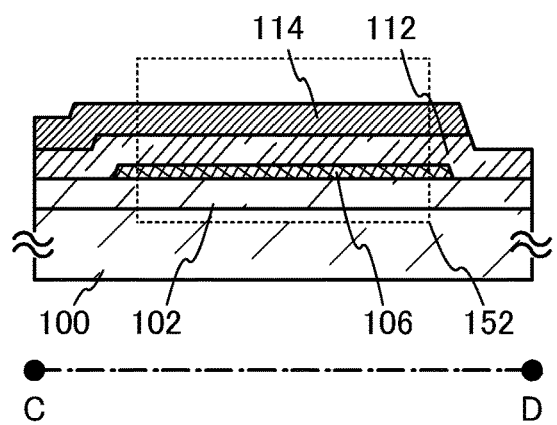

FIGS. 2A to 2C are a top view and cross-sectional views of a transistor 152 which is a top-gate bottom-contact type as an example of a semiconductor device which is different from the semiconductor device of the transistor 151. Here, FIG. 2A is a top view, FIG. 2B is a cross-sectional view taken along A-B of FIG. 2A, and FIG. 2C is a cross-sectional view taken along C-D of FIG. 2A. Note that in FIG. 2A, some of components of the transistor 152 (e.g., a gate insulating layer 112) are omitted for brevity.

The transistor 152 illustrated in FIGS. 2A to 2C is the same as the transistor 151 in that it includes a substrate 100, a base insulating layer 102, an oxide semiconductor layer 106, a source electrode 108a, a drain electrode 108b, a gate insulating layer 112, and a gate electrode 114. The differences between the transistor 152 and the transistor 151 are the positions where the oxide semiconductor layer 106 is connected to the source electrode 108a and the drain electrode 108b. That is, in the transistor 152, the source electrode 108a and the drain electrode 108b are in contact with bottom portions of the oxide semiconductor layer 106. The other components are similar to those of the transistor 151 in FIGS. 1A to 1C.

Figure 3A:
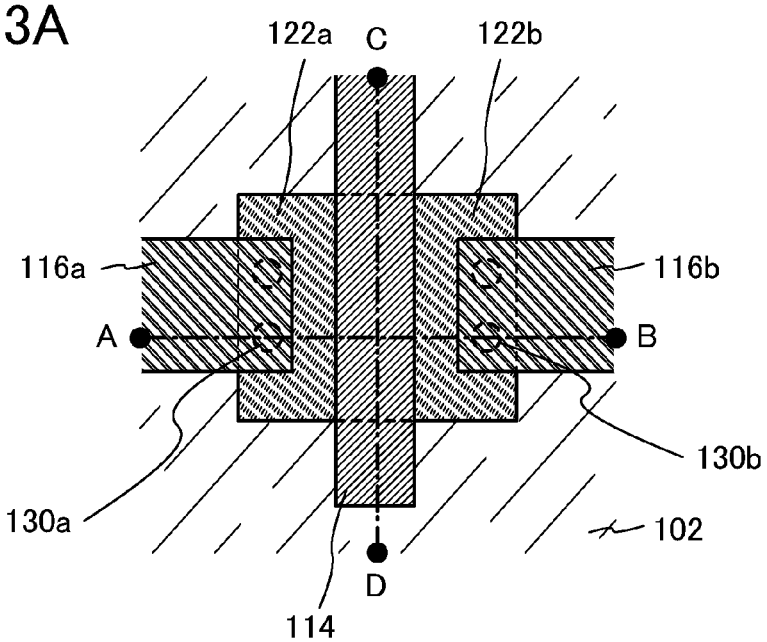
FIGS. 3A to 3C are a top view and cross-sectional views showing an example of a semiconductor device which is one embodiment of the present invention.
Figure 3B:
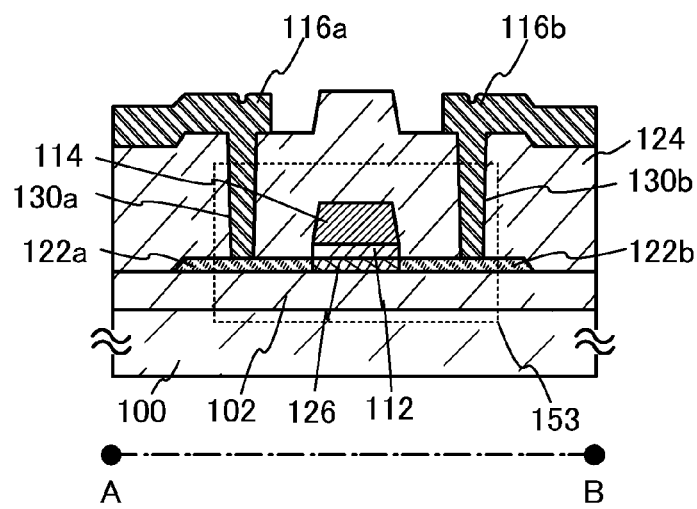
Figure 3C:
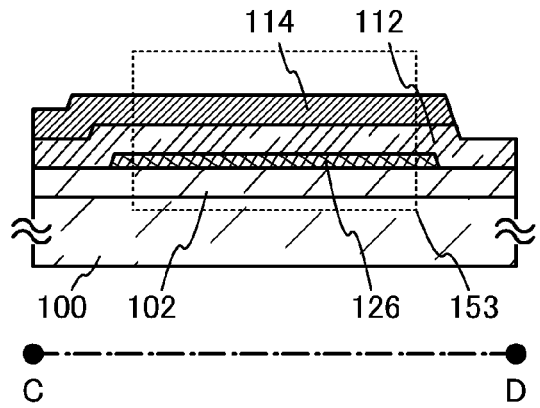

FIGS. 3A to 3C are a top view and cross-sectional views of a transistor 153 which is a coplanar top-gate top-contact type as an example of a semiconductor device which is different from the semiconductor devices of the transistor 151 and the transistor 152. Here, FIG. 3A is a top view, FIG. 3B is a cross-sectional view taken along A-B of FIG. 3A, and FIG. 3C is a cross-sectional view taken along C-D of FIG. 3A. Note that in FIG. 3A, some of components of the transistor 153 (e.g., a gate insulating layer 112) are omitted for brevity.

The transistor 153 illustrated in FIGS. 3A to 3C is the same as the transistor 151 and the transistor 152 in that it includes a base insulating layer 102, the gate insulating layer 112, and a gate electrode 114. The transistor 153 is different from the transistor 151 and the transistor 152 in that a channel region 126, a source region 122a, and a drain region 122b are formed in the same plane of the oxide semiconductor layer, and the source region 122a and the drain region 122b are connected to a wiring 116a and a wiring 116b through a contact hole 130a and a contact hole 130b which are provided in an interlayer insulating layer 124, respectively.

In the transistor 153, the base insulating layer 102 may have the same structure as the base insulating layer 102 of the transistor 151. After the oxide semiconductor layer 106 is formed, the gate insulating layer 112 and the gate electrode 114 are formed. The gate electrode 114 and the gate insulating layer 112 can be formed by processing with the use of the same mask. Alternatively, after the process of the gate electrode 114, the gate insulating layer 112 may be processed using the gate electrode 114 as a mask. Note that although different from the structure illustrated, the gate insulating layer 112 is not necessarily processed after the gate electrode 114 is formed. In other words, the gate insulating layer 112 may be provided over the base insulating layer 102, the source region 122a, the drain region 122b, and the channel region 126.

Next, treatment for reducing the resistance of the oxide semiconductor layer is performed using the gate electrode 114 as a mask, so that the source region 122a and the drain region 122b are formed. A region of the oxide semiconductor layer located under the gate electrode 114 is the channel region 126.

As the treatment for reducing the resistance, for example, argon plasma treatment, ammonia plasma treatment, hydrogen plasma treatment, and the like can be given.

An example of a manufacturing process of the transistor 151 illustrated in FIGS. 1A to 1C will be described with reference to FIGS. 4A to 4E.

First, first heat treatment is performed on a substrate 100. The first heat treatment is performed at a temperature at which hydrogen which is adsorbed or contained in the substrate can be eliminated. Specifically, the temperature of the first heat treatment is higher than or equal to 100° C. and lower than the strain point of the substrate, preferably higher than or equal to 300° C. and lower than or equal to 600° C. The first heat treatment is performed for longer than or equal to 1 minute and shorter than or equal to 72 hours. A molecule including hydrogen, which is adsorbed on the substrate surface, or the like can be reduced by the first heat treatment. The first heat treatment is performed under an atmosphere that does not contain hydrogen. The first heat treatment is preferably performed in high vacuum of less than or equal to $1 \times 10^{-4}$ Pa.

There is no particular limitation on the property of a material and the like of the substrate 100 as long as the material has heat resistance enough to withstand at least heat treatment to be performed later. For example, a glass substrate, a ceramic substrate, a quartz substrate, a sapphire substrate, or the like may be used as the substrate 100. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 100. Still alternatively, any of these substrates further provided with a semiconductor element may be used as the substrate 100.

A flexible substrate may be used as the substrate 100. In the case where a transistor is provided over a flexible substrate, either of the following methods can be employed: a method in which a transistor is directly formed on a flexible substrate; and a method in which a transistor is formed over a different substrate and then separated from the substrate and transferred onto a flexible substrate. In order to separate the transistor to transfer it to the flexible substrate, a separation layer is preferably provided between the different substrate and the transistor.

Next, a base insulating layer 102 is formed over the substrate 100.

As a formation method of the base insulating layer 102, a plasma CVD method or a sputtering method can be employed, for example. The base insulating layer from which oxygen is released by heating is preferably formed by a sputtering method. The base insulating layer 102 may be formed to have a single-layer structure or a stacked-layer structure using at least any of silicon oxide, silicon oxynitride, silicon nitride oxide, and aluminum oxide, for example. The total thickness of the base insulating layer 102 is greater than or equal to 50 nm, preferably greater than or equal to 200 nm. When the base insulating layer 102 having a large thickness is provided, the amount of oxygen released from the base insulating layer 102 can be increased. Further, when the base insulating layer 102 having a large thickness is provided, the physical distance from the interface between the substrate 100 and the base insulating layer 102 to the oxide semiconductor layer serving as a channel region is increased; thus, the adverse effect caused by diffusion of hydrogen which is adsorbed on the interface between the substrate and the base insulating layer can be reduced.

In order to form by a sputtering method the insulating layer from which oxygen is released by heating, in the case where oxygen or a mixed gas of oxygen and a rare gas (such as argon) is used as a film formation gas, the proportion of oxygen is preferably set higher. For example, the concentration of oxygen in the whole gas is preferably set to be higher than or equal to 6% and lower than 100%.

For example, a silicon oxide layer is formed by an RF sputtering method under the following conditions: quartz (preferably synthetic quartz) is used as a target; the substrate temperature is higher than or equal to 30° C. and lower than or equal to 450° C. (preferably higher than or equal to 70° C. and lower than or equal to 200° C.); the distance between the substrate and the target (the T-S distance) is greater than or equal to 20 mm and less than or equal to 400 mm (preferably greater than or equal to 40 mm and less than or equal to 200 mm); the pressure is higher than or equal to 0.1 Pa and lower than or equal to 4 Pa (preferably higher than or equal to 0.2 Pa and lower than or equal to 1.2 Pa), the high-frequency power is higher than or equal to 0.5 kW and lower than or equal to 12 kW (preferably higher than or equal to 1 kW and lower than or equal to 5 kW); and the proportion of oxygen ($O_2/(O_2+Ar)$) in the film formation gas is higher than or equal to 1% and lower than or equal to 100% (preferably higher than or equal to 6% and lower than or equal to 100%). Note that a silicon target may be used as the target instead of the quartz (preferably synthetic quartz) target. As the film formation gas, oxygen or a mixed gas of oxygen and argon is used.

In the case where the base insulating layer 102 is formed to have a stacked-layer structure, it is preferable that a silicon oxide film whose substrate temperature is higher than or equal to 450° C. and lower than or equal to 600° C. be formed as a first layer, and a silicon oxide film whose substrate temperature is higher than or equal to 150° C. and lower than or equal to 350° C. be formed as a second layer. When the first silicon oxide film is formed at a high temperature of higher than or equal to 450° C., a molecule including hydrogen, which is adsorbed on the substrate surface and cannot be completely reduced by the first heat treatment, a molecule including hydrogen, which is adsorbed on the substrate surface after the first heat treatment, or the like can be reduced. Further, when the second silicon oxide film is formed at a temperature higher than or equal to 150° C. and lower than or equal to 350° C., a silicon oxide film from which oxygen is released by heating can be formed. Note that the first silicon oxide film and the second silicon oxide film are successively formed in vacuum.

Figure 4A:
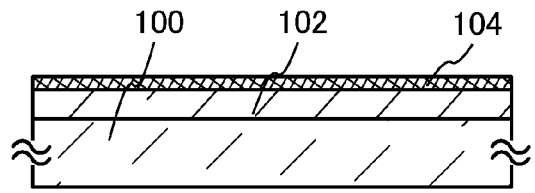
FIGS. 4A to 4E are cross-sectional views showing an example of a manufacturing process of a semiconductor device which is one embodiment of the present invention.

Next, an oxide semiconductor layer 104 is formed over the base insulating layer 102 (see FIG. 4A).

Note that through the step of performing the first heat treatment to the step of forming the oxide semiconductor layer 104, the steps are performed without exposure to the air. It is preferable that these steps be successively performed in vacuum. By successively performing in vacuum the step of performing the first heat treatment to the step of forming the oxide semiconductor layer 104, contamination of the substrate surface and absorption of a molecule including hydrogen can be suppressed and therefore diffusion of hydrogen into the oxide semiconductor layer, which is due to subsequent heat treatment, can be reduced.

Then, second heat treatment is performed. The second heat treatment is performed at a temperature at which oxygen is supplied from the base insulating layer to the oxide semiconductor layer. Specifically, the temperature of the second heat treatment is higher than or equal to 150° C. and lower than the strain point of the substrate, preferably higher than or equal to 250° C. and lower than or equal to 450° C. By the second treatment, oxygen is released from the base insulating layer 102, whereby the interface state between the base insulating layer 104 and the oxide semiconductor layer 102 and the oxygen deficiency in the oxide semiconductor layer 104 can be reduced. Note that the second heat treatment may be performed at any timing as long as it is performed after the oxide semiconductor layer 104 is formed. In addition, the second heat treatment may be performed once or plural times. The atmosphere of the second heat treatment is an oxidizing gas atmosphere or an inert gas atmosphere, and the second heat treatment is performed for longer than or equal to 1 minute and shorter than or equal to 72 hours.

By the second heat treatment, the oxygen deficiency in the oxide semiconductor layer is reduced. Further, since the adverse effect caused by diffusion of hydrogen that exists on the substrate surface can be reduced, a manufactured transistor can have normally-off characteristics.

Note that a heat treatment apparatus is not limited to an electric furnace, and may include a device for heating an object to be processed by heat conduction or heat radiation from a medium such as a heated gas. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object to be processed by radiation of light (electromagnetic waves) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high temperature gas. As the high temperature gas, used is an inert gas which does not react with an object to be processed in heat treatment, for example, nitrogen or a rare gas such as argon.

Note that an inert gas is a gas that contains nitrogen or a rare gas (e.g., helium, neon, or argon) as its main component and, preferably, does not contain water, hydrogen, or the like. For example, the purity of nitrogen or a rare gas such as helium, neon, or argon introduced into a heat treatment apparatus is set to 6N (99.9999%) or higher, preferably 7N (99.99999%) or higher (i.e., the impurity concentration is 1 ppm or lower, preferably 0.1 ppm or lower). An inert gas atmosphere is an atmosphere that contains an inert gas as its main component and contains a reactive gas of lower than 10 ppm. The reactive gas is a gas that reacts with a semiconductor, metal, or the like.

Note that the oxidizing gas is oxygen, ozone, nitrous oxide, or the like, and it is preferable that the oxidizing gas do not contain water, hydrogen, and the like. For example, the purity of oxygen, ozone, or nitrous oxide introduced into a heat treatment apparatus is set to 6N (99.9999%) or higher, preferably 7N (99.99999%) or higher (i.e., the impurity concentration is 1 ppm or lower, preferably 0.1 ppm or lower). As the oxidizing gas atmosphere, an atmosphere in which an oxidizing gas is mixed with an inert gas may be used, and the oxidizing gas of at least 10 ppm is contained.

For example, the oxide semiconductor layer can be formed by a sputtering method, a vacuum evaporation method, a pulse laser deposition method, a CVD method, or the like. The thickness of the oxide semiconductor layer is preferably greater than or equal to 3 nm and less than or equal to 50 nm. This is because when the oxide semiconductor layer is too thick (e.g., 100 nm or more), there is a possibility that the short channel effect might have a large influence and the transistor with small size might have normally-on characteristics.

In this embodiment, the oxide semiconductor layer 104 is formed by a sputtering method using an In—Ga—Zn—O-based oxide target.

As the In—Ga—Zn—O-based oxide target, for example, an oxide target having a composition ratio of $In_2O_3:Ga_2O_3:ZnO=1:1:1$ [molar ratio] is used. Note that it is not necessary to limit the material and the composition ratio of the target to the above. For example, an oxide target having a composition ratio of $In_2O_3:Ga_2O_3:ZnO=1:1:2$ [molar ratio] can also be used.

The relative density of the oxide target is higher than or equal to 90% and lower than or equal to 100%, preferably higher than or equal to 95% and lower than or equal 100%. This is because, with the use of the metal oxide target with a high relative density, the dense oxide semiconductor layer can be formed.

The film formation may be performed under a rare gas (typically argon) atmosphere, an oxygen atmosphere, a mixed atmosphere containing a rare gas and oxygen, or the like. Further, it is preferably performed under an atmosphere using a high-purity gas in which hydrogen is sufficiently removed so that entry of hydrogen into the oxide semiconductor layer can be prevented.

The oxide semiconductor layer may be subjected to plasma treatment containing oxygen. By performing plasma treatment containing oxygen on the oxide semiconductor layer, the oxygen can be contained either or both in the oxide semiconductor layer and in the vicinity of the interface of the oxide semiconductor layer. In that case, the amount of oxygen contained in the oxide semiconductor layer is greater than the stoichiometric proportion of the oxide semiconductor layer, preferably greater than the stoichiometric proportion and less than the double of the stoichiometric proportion. Alternatively, the amount of oxygen contained may be greater than Y, preferably greater than Y and less than 2Y, where the amount of oxygen contained in the case where a material of the oxide semiconductor layer is single crystal is Y. Still alternatively, the amount of oxygen may be greater than Z, preferably greater than Z and less than 2Z based on the amount of oxygen Z in the insulating layer in the case where oxygen doping is not performed. The reason why the above preferable range has the upper limit is that the oxide semiconductor layer might absorb hydrogen, as a hydrogen absorbing alloy (a hydrogen storage alloy) does, when the amount of oxygen is too large. Note that in the oxide semiconductor film, the amount of oxygen is larger than the amount of hydrogen.

For example, the oxide semiconductor layer 104 can be formed as follows.

An example of the film formation conditions is as follows: the distance between the substrate and the target is 60 mm; the pressure is 0.4 Pa; the direct-current (DC) power is 0.5 kW; and the film formation atmosphere is a mixed atmosphere containing argon and oxygen (the flow rate of the oxygen is 33%). Note that a pulse DC sputtering method is preferable because powder substances (also referred to as particles or dust) generated in film formation can be reduced and the film thickness can be uniform.

Figure 4B:
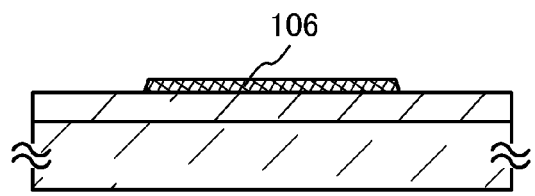

Next, an oxide semiconductor layer 106 having an island shape is formed by processing the oxide semiconductor layer 104 (see FIG. 4B).

The oxide semiconductor layer 104 is processed by etching after a mask having a desired shape is formed over the oxide semiconductor layer. The mask is formed by a method such as photolithography. Alternatively, the mask may be formed by an ink-jet method or the like.

For the etching of the oxide semiconductor layer, either wet etching or dry etching may be employed. It is needless to say that both of them may be employed in combination.

Figure 4C:
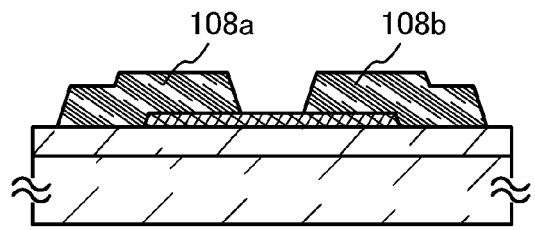

Next, a conductive layer for forming the source electrode and the drain electrode (including a wiring formed in the same layer as the source electrode and the drain electrode) is formed over the base insulating layer 102 and the oxide semiconductor layer 106, and a source electrode 108a and a drain electrode 108b are formed by processing the conductive layer (see FIG. 4C). The channel length L of the transistor depends on the distance between the edges of the source electrode 108a and the drain electrode 108b which are formed here.

The conductive layer can be processed by etching with the use of a resist mask. Ultraviolet, KrF laser light, ArF laser light, or the like is preferably used for light exposure for forming a resist mask for the etching.

In the case where light exposure is performed so that the channel length L is less than 25 nm, the light exposure at the time of forming the resist mask is preferably performed using, for example, extreme ultraviolet having an extremely short wavelength of several nanometers to several tens of nanometers. In the light exposure using extreme ultraviolet, the resolution is high and the focus depth is large. Thus, the channel length L of the transistor formed later can be shortened, whereby the operation speed of a circuit can be increased.

Etching may be performed with the use of a resist mask formed using a so-called multi-tone mask. A resist mask formed using a multi-tone mask has a plurality of thicknesses and the resist mask can be further changed in shape by ashing. Thus, such a resist mask can be used in a plurality of etching steps for different patterns. Therefore, a resist mask for at least two kinds of patterns can be formed using a multi-tone mask, resulting in simplification of the process.

Note that in etching of the conductive layer, part of the oxide semiconductor layer 106 is etched, so that the oxide semiconductor layer having a groove (a recessed portion) is formed in some cases.

After that, by plasma treatment using a gas such as oxygen, ozone, or nitrous oxide, a surface of an exposed portion of the oxide semiconductor layer 106 may be oxidized and oxygen deficiency may be reduced. In the case where plasma treatment is performed, a gate insulating layer 112 which is to be in contact with part of the oxide semiconductor layer 106 is preferably formed without being exposed to the air, following the plasma treatment.

Figure 4D:
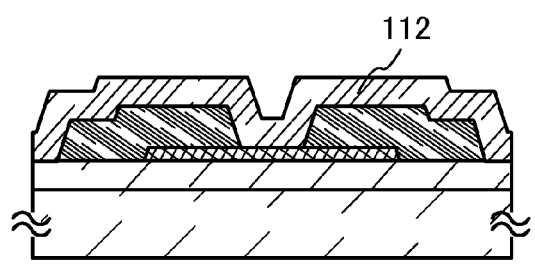

Next, the gate insulating layer 112 is provided so as to cover the source electrode 108a and the drain electrode 108b and to be in contact with part of the oxide semiconductor layer 106 (see FIG. 4D).

The gate insulating layer 112 is formed by, for example, a sputtering method, a plasma CVD method, or the like. The total thickness of the gate insulating layer 112 is preferably greater than or equal to 1 nm and less than or equal to 300 nm, more preferably greater than or equal to 5 nm and less than or equal to 50 nm. The larger the thickness of the gate insulating layer is, the more easily a short channel effect occurs; thus, the threshold voltage tends to shift negatively. In addition, it is found that when the thickness of the gate insulating layer is less than or equal to 5 nm, leakage current due to a tunnel current is increased.

Figure 4E:
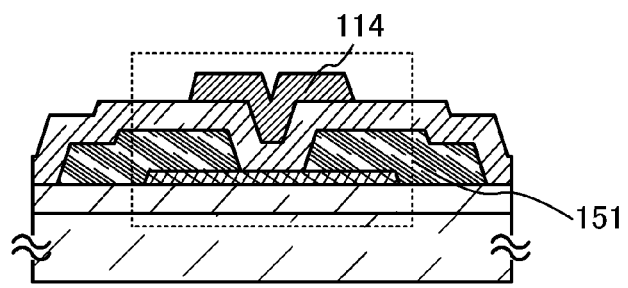

Then, a gate electrode 114 is formed (see FIG. 4E). A conductive layer to be the gate electrode 114 is formed by, for example, a sputtering method, an evaporation method, a coating method, or the like and is processed by etching with the use of a resist mask.

Through the above process, the transistor 151 can be manufactured.

Next, an example of a manufacturing process of the transistor 152 illustrated in FIGS. 2A to 2C will be described with reference to FIGS. 5A to 5E.

First, first heat treatment is performed on a substrate 100.

Figure 5A:
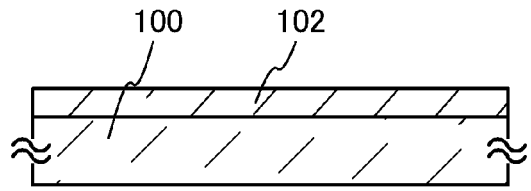
FIGS. 5A to 5E are cross-sectional views showing an example of a manufacturing process of a semiconductor device which is one embodiment of the present invention.

Next, a base insulating layer 102 is formed over the substrate 100 without exposure to the air after the first heat treatment (see FIG. 5A). It is preferable that the first heat treatment and the formation of the base insulating layer 102 be successively performed in vacuum.

Figure 5B:
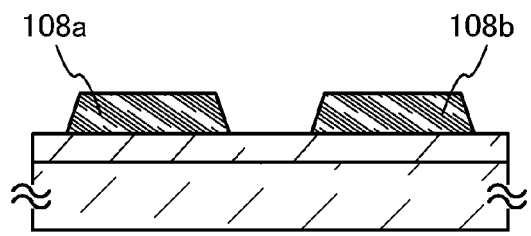
Figure 5C:
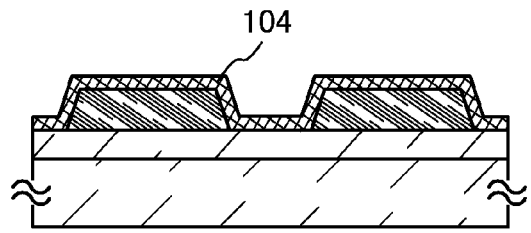

Next, a conductive layer for forming the source electrode and the drain electrode (including a wiring formed in the same layer as the source electrode and the drain electrode) is formed over the base insulating layer 102, and a source electrode 108a and a drain electrode 108b are formed by processing the conductive layer (see FIG. 5B).

Next, heat treatment similar to the first heat treatment is performed so that hydrogen adsorbed on the surfaces of the base insulating layer 102, the source electrode 108a, and the drain electrode 108b is reduced. After that, an oxide semiconductor layer 104 is formed without exposure to the air (see FIG. 5C). It is preferable that the heat treatment and the formation of the oxide semiconductor layer 104 be successively performed in vacuum.

Next, second heat treatment is performed.

Next, an oxide semiconductor layer 106 is formed by processing the oxide semiconductor layer 104.

Figure 5D:
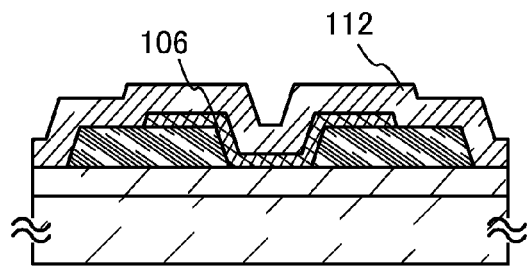

Next, a gate insulating layer 112 is formed so as to cover the oxide semiconductor layer 106 and to be in contact with part of the source electrode 108a and the drain electrode 108b (see FIG. 5D).

Figure 5E:
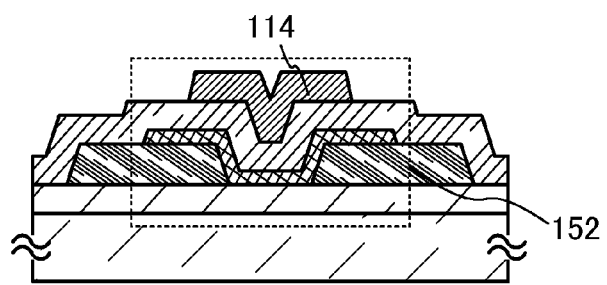

Then, a gate electrode 114 is formed (see FIG. 5E).

Through the above process, the transistor 152 can be manufactured.

An example of a manufacturing process of the transistor 153 illustrated in FIGS. 3A to 3C will be described with reference to FIGS. 6A to 6E.

First, first heat treatment is performed on a substrate 100.

Next, a base insulating layer 102 is formed over the substrate 100.

Figure 6A:
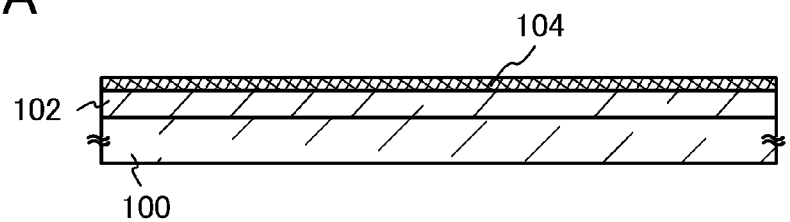
FIGS. 6A to 6E are cross-sectional views showing an example of a manufacturing process of a semiconductor device which is one embodiment of the present invention.

Next, an oxide semiconductor layer 104 is formed over the base insulating layer 102 (see FIG. 6A).

Note that through the step of performing the first heat treatment to the step of forming the oxide semiconductor layer 104, the steps are performed without exposure to the air. It is preferable that these steps be successively performed in vacuum.

Then, second heat treatment is performed.

Figure 6B:
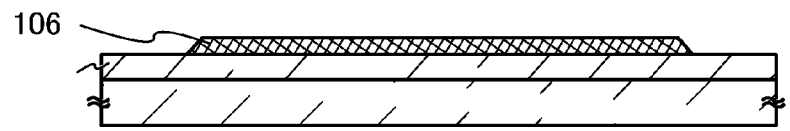

Next, an oxide semiconductor layer 106 having an island shape is formed by processing the oxide semiconductor layer 104 (see FIG. 6B).

Figure 6C:
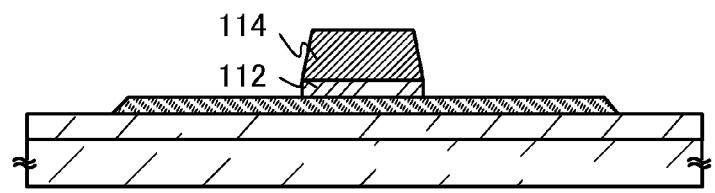
Figure 6D:
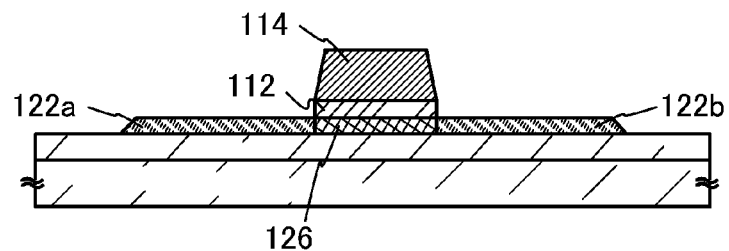
Figure 6E:
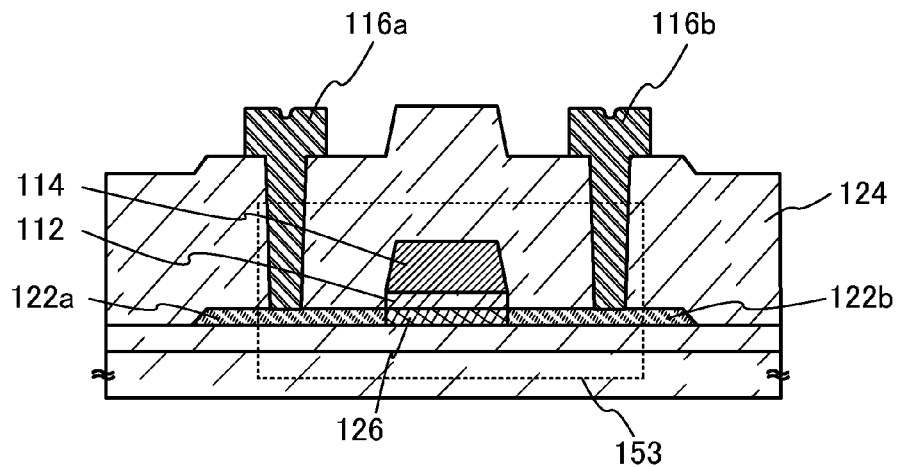

Next, a gate insulating layer 112 and a gate electrode 114 are formed by forming an insulating layer and a conductive layer and processing the insulating layer and the conductive layer to have similar patterns by photolithography (see FIG. 6C). At this time, after the formation of the gate electrode 114, the gate insulating layer 112 may be formed using the gate electrode 114 as a mask. Note that although different from the structure illustrated, the gate insulating layer 112 is not necessarily processed after the gate electrode 114 is formed.

Next, treatment for reducing the resistance of the oxide semiconductor layer 106 is performed using the gate electrode 114 as a mask, so that a source region 122a and a drain region 122b are formed. A region under the gate electrode becomes a channel region 126 (see FIG. 6D). At this time, a channel length L of the transistor is determined by the width of the gate electrode. By patterning using the gate electrode as the mask in such a manner, the source region and the drain region do not overlap with the gate electrode and parasitic capacitance is not generated in this region; therefore, the operation speed of the transistor can be increased.

Next, an interlayer insulating layer 124 is formed and openings are provided in regions of the interlayer insulating layer 124, which overlap with the source region 122a and the drain region 122b. A conductive layer is formed so as to be connected to the source region and the drain region and processed, whereby a wiring 116a and a wiring 116b are formed (see FIG. 6E).

Through the above process, the transistor 153 can be manufactured.

By applying this embodiment, hydrogen diffused into an oxide semiconductor layer is removed so that oxygen can be supplied to the oxide semiconductor layer and the interface between the base insulating layer and the oxide semiconductor layer. Therefore, a transistor having normally-off characteristics, high reliability, and a small current value in the case where a gate voltage is not applied can be provided.

The structures, the methods, and the like described in this embodiment may be combined as appropriate with any of the structures, the methods, and the like described in the other embodiments.

Embodiment 2

A semiconductor device (also referred to as a display device) with a display function can be manufactured using the transistor, an example of which is shown in Embodiment 1. Some or all driver circuits including the transistors can be formed over a substrate where a pixel portion is formed, whereby a system-on-panel can be obtained.

Figure 7A:
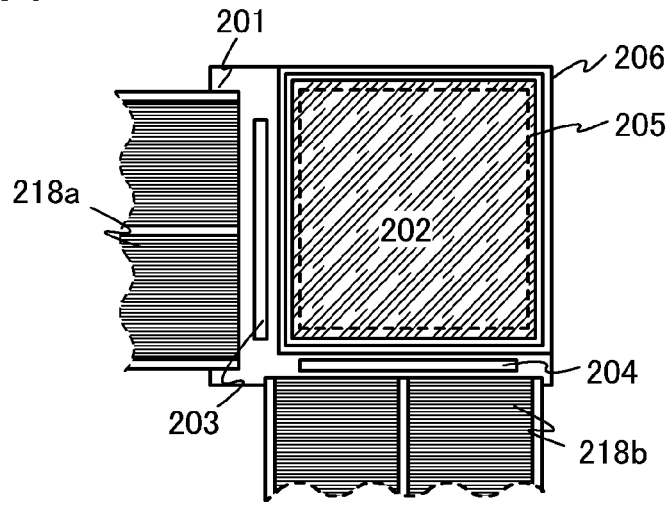
FIGS. 7A to 7C are diagrams each illustrating one mode of a semiconductor device which is one embodiment of the present invention.

In FIG. 7A, a sealant 205 is provided to surround a pixel portion 202 provided over a first substrate 201, and the pixel portion 202 is sealed with the sealant 205 between the first substrate 201 and a second substrate 206. In FIG. 7A, a scan line driver circuit 204 and a signal line driver circuit 203 each are formed using a single crystal semiconductor layer or a polycrystalline semiconductor layer over a substrate prepared separately, and mounted in a region different from the region surrounded by the sealant 205 over the first substrate 201. Various signals and potentials are supplied to the signal line driver circuit 203 and the scan line driver circuit 204, each of which is separately formed, and the pixel portion 202, from flexible printed circuits (FPCs) 218a and 218b.

Figure 7B:
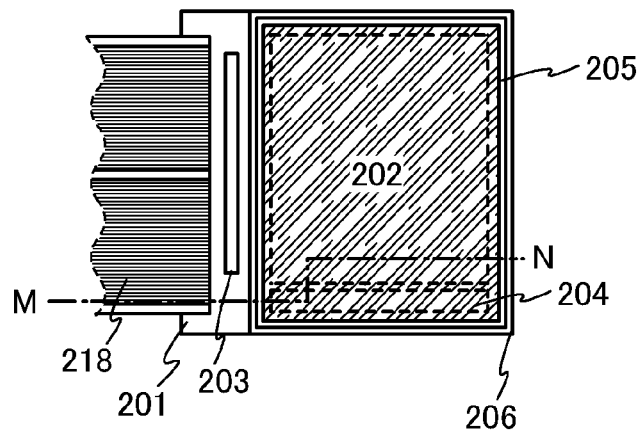
Figure 7C:
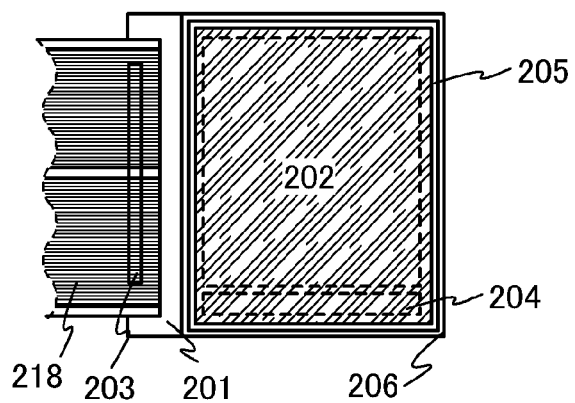

In FIGS. 7B and 7C, the sealant 205 is provided to surround the pixel portion 202 and the scan line driver circuit 204 which are provided over the first substrate 201. The second substrate 206 is provided over the pixel portion 202 and the scan line driver circuit 204. Thus, the pixel portion 202 and the scan line driver circuit 204 are sealed together with a display element, by the first substrate 201, the sealant 205, and the second substrate 206. In FIGS. 7B and 7C, the signal line driver circuit 203 is formed using a single crystal semiconductor layer or a polycrystalline semiconductor layer over a substrate prepared separately, and mounted in a region different from the region surrounded by the sealant 205 over the first substrate 201. In FIGS. 7B and 7C, various signals and potentials are supplied to the signal line driver circuit 203 which is separately formed, the scan line driver circuit 204, and the pixel portion 202, from an FPC 218.

Although FIGS. 7B and 7C each show the example in which the signal line driver circuit 203 is formed separately and mounted on the first substrate 201, one embodiment of the present invention is not limited to this structure. The scan line driver circuit may be separately formed and then mounted, or only part of the signal line driver circuit or part of the scan line driver circuit may be separately formed and then mounted.

Note that a method for connecting a separately formed driver circuit is not particularly limited, and a chip on glass (COG) method, a wire bonding method, a tape automated bonding (TAB) method, or the like may be used. FIG. 7A shows an example in which the signal line driver circuit 203 and the scan line driver circuit 204 are mounted by a COG method. FIG. 7B shows an example in which the signal line driver circuit 203 is mounted by a COG method. FIG. 7C shows an example in which the signal line driver circuit 203 is mounted by a TAB method.

The display device includes in its category a panel in which a display element is sealed and a module in which an IC such as a controller is mounted on the panel.

Note that a display device in this specification means an image display device, a display device, or a light source (including a lighting device). The display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion and the scan line driver circuit provided over the first substrate 201 include a plurality of transistors, and any of transistors which are described in Embodiment 1 as the examples can be applied.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can also be used.

Figure 8:
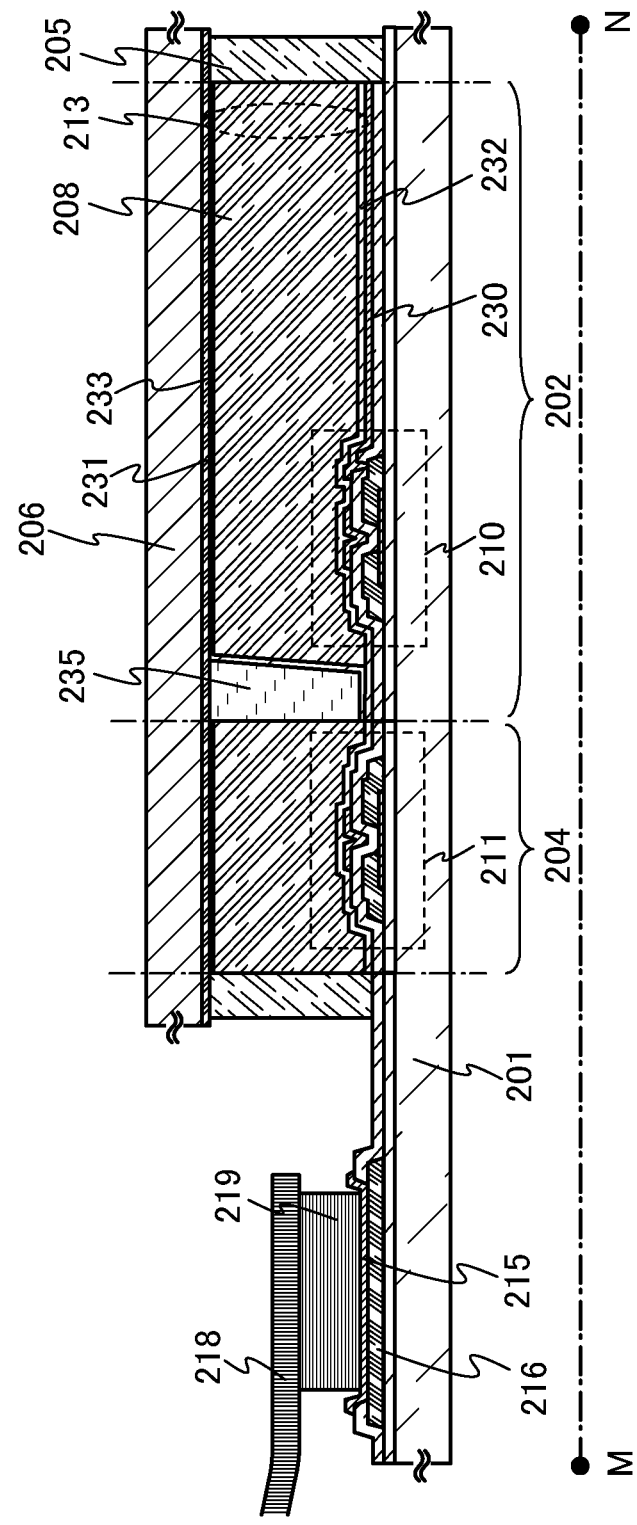
FIG. 8 is a cross-sectional view illustrating one mode of a semiconductor device which is one embodiment of the present invention.
Figure 9:
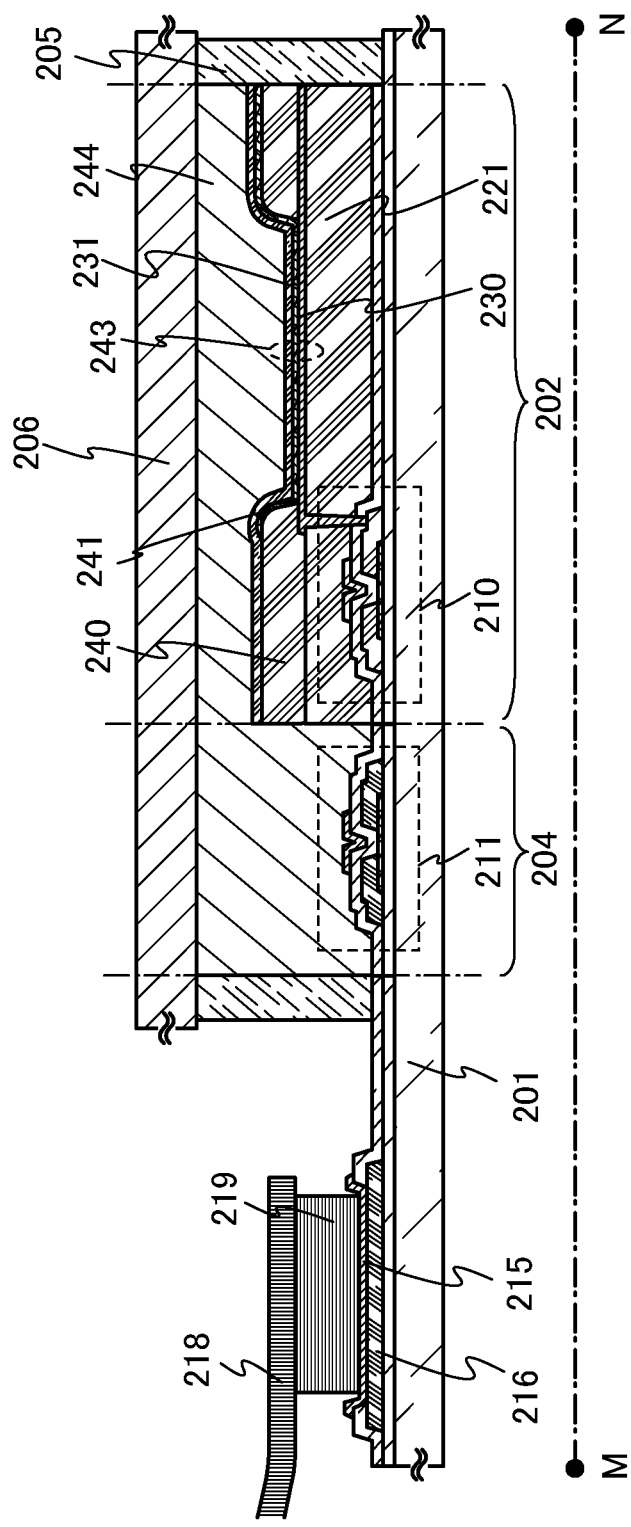
FIG. 9 is a cross-sectional view illustrating one mode of a semiconductor device which is one embodiment of the present invention.
Figure 10:
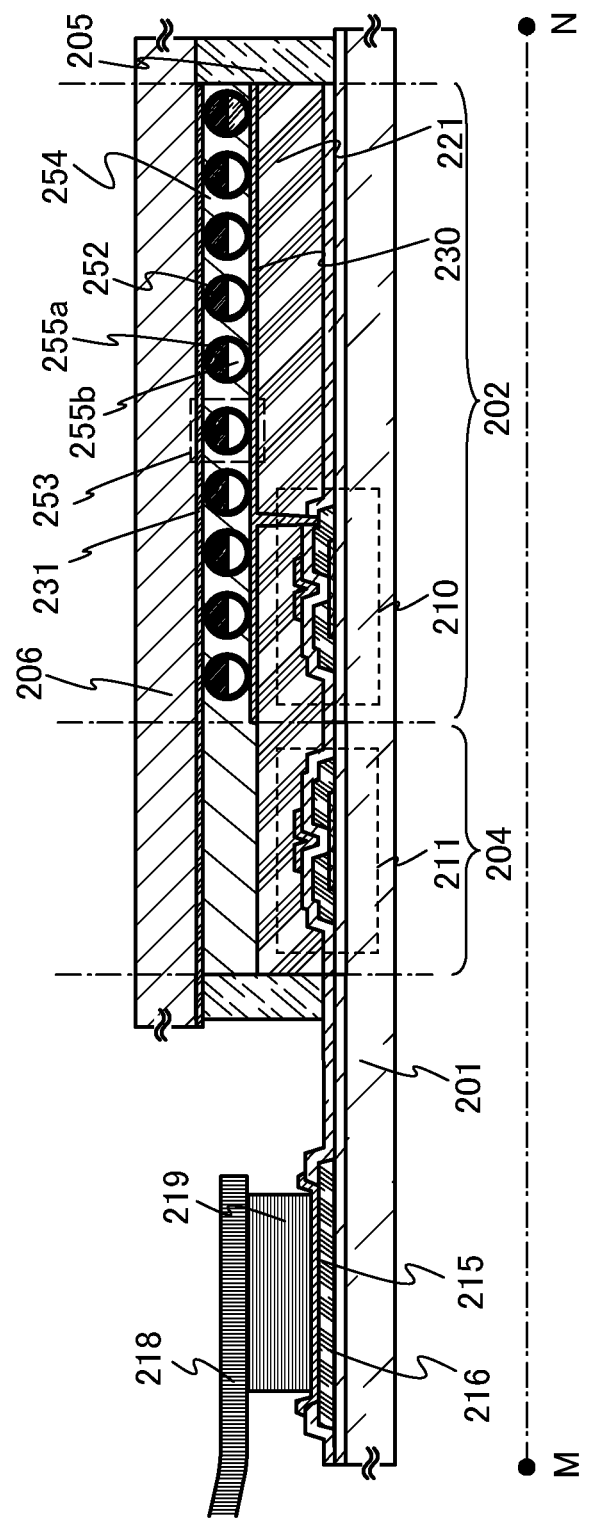
FIG. 10 is a cross-sectional view illustrating one mode of a semiconductor device which is one embodiment of the present invention.

One embodiment of the semiconductor device is described with reference to FIG. 8, FIG. 9, and FIG. 10. FIG. 8, FIG. 9, and FIG. 10 correspond to cross-sectional views taken along line M-N in FIG. 7B.

As illustrated in FIG. 8, FIG. 9, and FIG. 10, the semiconductor device includes a connection terminal electrode 215 and a terminal electrode 216. The connection terminal electrode 215 and the terminal electrode 216 are electrically connected to a terminal included in the FPC 218 through an anisotropic conductive layer 219.

The connection terminal electrode 215 is formed of the same conductive layer as a first electrode 230. The terminal electrode 216 is formed of the same conductive layer as a source electrode and a drain electrode of a transistor 210 and a transistor 211.

Each of the pixel portion 202 and the scan line driver circuit 204 provided over the first substrate 201 includes a plurality of transistors. In FIG. 8, FIG. 9, and FIG. 10, the transistor 210 included in the pixel portion 202 and the transistor 211 included in the scan line driver circuit 204 are illustrated as an example.

In this embodiment, any of the transistors described in Embodiment 1 can be applied to the transistors 210 and 211. Fluctuation in the electric characteristics of the transistors 210 and 211 is suppressed and the transistors 210 and 211 are electrically stable. As described above, a semiconductor device with high reliability can be provided as the semiconductor devices in this embodiment in FIG. 8, FIG. 9, and FIG. 10.

The transistor 210 provided in the pixel portion 202 is electrically connected to the display element to form a display panel. A variety of display elements can be used as the display element as long as display can be performed.

FIG. 8 shows an example of a liquid crystal display device using a liquid crystal element as a display element. In FIG. 8, a liquid crystal element 213 is a display element including the first electrode 230, a second electrode 231, and a liquid crystal layer 208. Note that insulating layers 232 and 233 serving as alignment layers are provided so that the liquid crystal layer 208 is interposed therebetween. The second electrode 231 is formed on the second substrate 206 side. The first electrode 230 and the second electrode 231 are stacked with the liquid crystal layer 208 interposed therebetween.

A spacer 235, which is a columnar spacer obtained by selective etching of an insulating layer, is provided in order to control the thickness (a cell gap) of the liquid crystal layer 208. Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, a liquid crystal exhibiting a blue phase for which an alignment layer is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which a chiral material is mixed is used for the liquid crystal layer in order to improve the temperature range. The liquid crystal composition which includes a liquid crystal exhibiting a blue phase and a chiral agent has a short response time of less than or equal to 1 millisecond, has optical isotropy; therefore, alignment treatment is not necessary and viewing angle dependence is small. In addition, since an alignment layer does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be improved.

The specific resistivity of the liquid crystal material is $1\times10^9$ Ω·cm or more, preferably $1\times10^{11}$ Ω·cm or more, or more preferably $1\times10^{12}$ Ω·cm or more. Note that the specific resistivity in this specification is measured at 20° C.

The size of a storage capacitor provided in the liquid crystal display device is set in consideration of the leakage current of the transistor provided in the pixel portion or the like so that a charge can be held for a predetermined period. Since the transistor including a highly purified oxide semiconductor layer is used, a storage capacitor having capacitance which is less than or equal to ⅓, preferably less than or equal to ⅕ with respect to a liquid crystal capacitance of each pixel is sufficient to be provided.

In the transistor used in this embodiment, which includes a highly purified oxide semiconductor layer, the current in an off state (an off-state current) can be made small. Therefore, an electrical signal such as an image signal can be held for a long period, and a writing interval can be set long when the power is on. Accordingly, frequency of refresh operation can be reduced, which leads to an advantageous effect of suppressing power consumption.

The field-effect mobility of the transistor including a highly purified oxide semiconductor layer used in this embodiment can be relatively high, whereby high-speed operation is possible. Thus, by using the transistor in a pixel portion of the liquid crystal display device, a high-quality image can be provided. In addition, since the transistors can be separately provided in a driver circuit portion and a pixel portion over one substrate, the number of components of the liquid crystal display device can be reduced.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode is may be used. The vertical alignment mode is one of methods of controlling alignment of liquid crystal molecules of a liquid crystal display panel. The vertical alignment mode is a mode in which liquid crystal molecules are aligned vertically to a panel surface when a voltage is not applied. Some examples are given as the vertical alignment mode. For example, a multi-domain vertical alignment (MVA) mode, a patterned vertical alignment (PVA) mode, an ASV mode, and the like can be given. Moreover, it is possible to use a method called domain multiplication or multi-domain design, in which a pixel is divided into some regions (subpixels) and molecules are aligned in different directions in their respective regions.

In the display device, a black matrix (a light-blocking layer); an optical member (an optical substrate) such as a polarizing member, a retardation member, or an anti-reflection member; and the like are provided as appropriate. For example, circular polarization may be employed by using a polarizing substrate and a retardation substrate. In addition, a backlight, a side light, or the like may be used as a light source.

In addition, with the use of a plurality of light-emitting diodes (LEDs) as a backlight, a time-division display method (a field-sequential driving method) can be employed. With the field-sequential driving method, color display can be performed without using a color filter.

As a display method in the pixel portion, a progressive method, an interlace method, or the like is employed. Color elements controlled in a pixel at the time of color display are not limited to three colors: R, G, and B (R, G, and B correspond to red, green, and blue respectively). For example, R, G, B, and W (W corresponds to white), or R, G, B, and one or more of yellow, cyan, magenta, and the like can be used. The sizes of display regions may be different between respective dots of color elements. Note that the present invention is not limited to the application to a display device for color display but can also be applied to a display device for monochrome display.

Alternatively, as the display element included in the display device, a light-emitting element utilizing electroluminescence may be used. Light-emitting elements utilizing electroluminescence are categorized by whether a light-emitting material is an organic compound or an inorganic compound, and in general, the former is called an organic EL element and the latter is called an inorganic EL element.

In an organic EL element, by application of a voltage to a light-emitting element, electrons and holes are separately injected from a pair of electrodes into a layer containing a light-emitting organic compound, and current flows. Then, the carriers (electrons and holes) recombine, thereby emitting light. Owing to such a mechanism, such a light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made in this embodiment using an organic EL element as a light-emitting element.

In order to extract light emitted from the light-emitting element, at least one of a pair of electrodes may be transparent. Then, a transistor and a light-emitting element are formed over a substrate. The light-emitting element may have any of the following structure: a top emission structure in which light emission is extracted through the surface opposite to the substrate; a bottom emission structure in which light emission is extracted through the surface on the substrate side; or a dual emission structure in which light emission is extracted through the surface on the substrate side and the surface opposite to the substrate.

FIG. 9 shows an example of a light-emitting device using a light-emitting element as a display element. A light-emitting element 243 which is a display element is electrically connected to the transistor 210 provided in the pixel portion 202. The structure of the light-emitting element 243 is not limited to the stacked-layer structure including the first electrode 230, an electroluminescent layer 241, and the second electrode 231, which is illustrated in FIG. 9. The structure of the light-emitting element 243 may be changed as appropriate depending on a direction in which light is extracted from the light-emitting element 243, or the like.

A partition wall 240 can be formed using an organic insulating material or an inorganic insulating material. It is particularly preferable that the partition wall 240 be formed using a photosensitive resin material to have an opening over the first electrode 230 so that a sidewall of the opening is formed as a tilted surface with continuous curvature.

The electroluminescent layer 241 may be formed with either a single layer or a stacked layer of a plurality of layers.

A protective layer may be formed over the second electrode 231 and the partition wall 240 in order to prevent entry of oxygen, hydrogen, moisture, carbon dioxide, or the like into the light-emitting element 243. As the protective layer, a silicon nitride layer, a silicon nitride oxide layer, a diamond-like carbon (DLC) layer, and the like can be given. In a space sealed with the first substrate 201, the second substrate 206, and the sealant 205, a filler 244 is provided and tightly sealed. In such a manner, it is preferable that the light-emitting element be packaged (sealed) with a protective film (such as a laminate film or an ultraviolet curable resin film) or a cover material with high air-tightness and little degasification so that the light-emitting element is not exposed to the outside air.

As the filler 244, an ultraviolet curable resin or a thermosetting resin may be used in addition to an inert gas such as nitrogen or argon. For example, polyvinyl chloride (PVC), an acrylic resin, a polyimide resin, an epoxy resin, a silicone resin, polyvinyl butyral (PVB), ethylene vinyl acetate (EVA), or the like is used.

If needed, an optical film, such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, the polarizing plate or the circularly polarizing plate may be provided with an anti-reflection layer. For example, anti-glare treatment by which reflected light can be diffused by projections and depressions on the surface so as to reduce the glare may be performed.

Further, an electronic paper in which electronic ink is driven can be provided as the display device. The electronic paper is also called an electrophoretic display device (an electrophoretic display) and is advantageous in that it has the same level of readability as regular paper, it has less power consumption than other display devices, and it can be made thin and light.

An electrophoretic display device can have various modes. An electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Further, the first particles and the second particles have different colors (which may be colorless) from each other.

Thus, an electrophoretic display device is a display that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material thereof.

As the electronic paper, a display device using a twisting ball display method may be used. The twisting ball display method refers to a method in which spherical particles each colored in white and black are arranged between a first electrode and a second electrode which are electrodes used for a display element, and a potential difference is generated between the first electrode and the second electrode to control orientation of the spherical particles, so that display is performed.

FIG. 10 illustrates an active matrix electronic paper as one embodiment of a semiconductor device. The electronic paper in FIG. 10 is an example of a display device using a twisting ball display method.

Between the first electrode 230 connected to the transistor 210 and the second electrode 231 provided on the second substrate 206, spherical particles 253 each of which includes a black region 255a, a white region 255b, and a cavity 252 around the regions which is filled with liquid, are provided. A space around the spherical particles 253 is filled with a filler 254 such as a resin. The second electrode 231 corresponds to a common electrode (counter electrode). The second electrode 231 is electrically connected to a common potential line.

Note that in FIG. 8, FIG. 9, and FIG. 10, a flexible substrate as well as a glass substrate may be used as the first substrate 201 and the second substrate 206. For example, a plastic substrate having light-transmitting properties is used. For plastic, a fiberglass-reinforced plastics (FRP) plate, a polyvinyl fluoride (PVF) film, a polyester film, or an acrylic resin film is used. A sheet with a structure in which an aluminum foil is sandwiched between PVF films or polyester films may be used.

An insulating layer 221 can be formed using an organic insulating material or an inorganic insulating material. Note that an organic insulating material having heat resistance, such as an acrylic resin, a polyimide resin, a benzocyclobutene resin, a polyamide resin, or an epoxy resin is preferably used as a planarizing insulating layer. Other than such organic insulating materials, it is possible to use a low-dielectric constant material (a low-k material), a siloxane-based resin, phosphosilicate glass (PSG), borophosphosilicate glass (BPSG), or the like. The insulating layer 221 may be formed by stacking a plurality of insulating layers formed of these materials.

There is no particular limitation on the method for forming the insulating layer 221, and the insulating layer 221 can be formed, depending on a material thereof, by a sputtering method, a spin coating method, a dipping method, a spray coating method, a droplet discharging method (e.g., an ink-jet method, screen printing, or offset printing), roll coating, curtain coating, knife coating, or the like.

The display device performs display by transmitting light from a light source or a display element. Thus, the substrates and the thin films such as insulating layers and conductive layers provided in the pixel portion where light is transmitted have light-transmitting properties with respect to light in the visible-light wavelength range.

The first electrode and the second electrode (each of which are also referred to as a pixel electrode layer, a common electrode layer, a counter electrode layer, or the like) for applying a voltage to the display element may have light-transmitting properties or light-reflecting properties, which depends on the direction in which light is extracted, the position where the electrode is provided, and the pattern structure of the electrode.

The first electrode 230 and the second electrode 231 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

The first electrode 230 and the second electrode 231 is formed using one kind or plural kinds selected from metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a nitride thereof.

A conductive composition containing a conductive high molecule (also referred to as a conductive polymer) can be used for the first electrode 230 and the second electrode 231. As the conductive high molecule, a so-called 7c-electron conjugated conductive polymer may be used. For example, polyaniline or a derivative thereof, polypyrrole or a derivative thereof, polythiophene or a derivative thereof, and a copolymer of two or more of aniline, pyrrole, and thiophene or a derivative thereof can be given.

Since the transistor is easily broken due to static electricity or the like, a protective circuit for protecting the driver circuit is preferably provided. The protective circuit is preferably formed using a nonlinear element.

As described above, by using any of the transistors, the examples of which are shown in Embodiment 1, a highly reliable semiconductor device which consumes low power can be provided. Note that the transistors, the examples of which are shown in Embodiment 1 can be applied to not only semiconductor devices having the display functions described above but also semiconductor devices having a variety of functions, such as a power device which is mounted on a power supply circuit, a semiconductor integrated circuit such as an LSI, and a semiconductor device having an image sensor function of reading information of an object.

The structures, the methods, and the like described in this embodiment may be combined as appropriate with any of the structures, the methods, and the like described in the other embodiments.

Embodiment 3

A semiconductor device which is one embodiment of the present invention can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, and a large-sized game machine such as a pachinko machine. Examples of electronic devices each including the semiconductor device described in the above embodiment will be described.

Figure 11A:
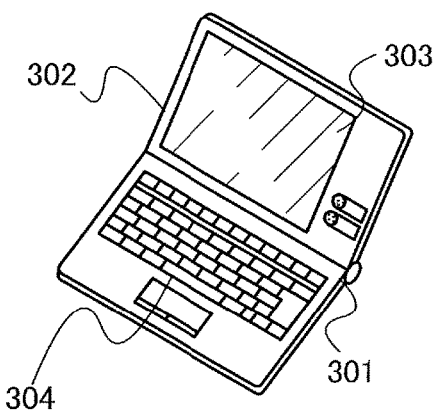
FIGS. 11A to 11E are diagrams each illustrating an electronic device as a semiconductor device which is one embodiment of the present invention.

FIG. 11A illustrates a laptop personal computer, which includes a main body 301, a housing 302, a display portion 303, a keyboard 304, and the like. By applying the semiconductor device described in Embodiment 1 or 2, the laptop personal computer can have high reliability.

Figure 11B:
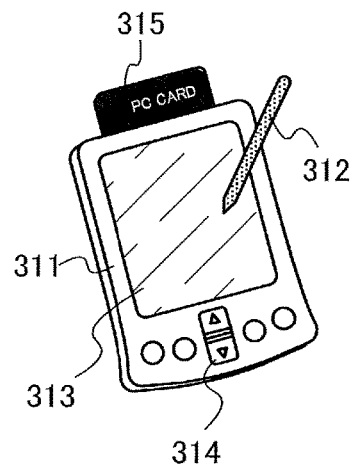

FIG. 11B illustrates a portable information terminal (PDA), which includes a display portion 313, an external interface 315, an operation button 314, and the like in a main body 311. A stylus 312 is included as an accessory for operation. By applying the semiconductor device described in Embodiment 1 or 2, the portable information terminal (PDA) can have higher reliability.

Figure 11C:
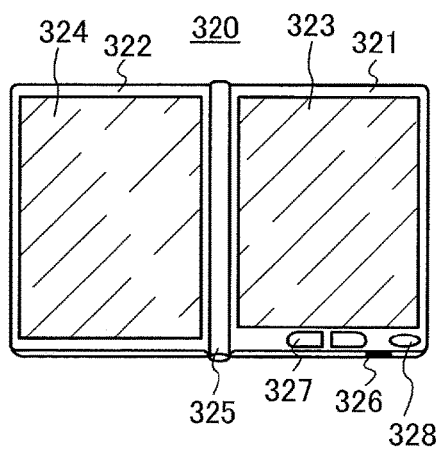

FIG. 11C shows an example of an e-book reader. For example, an e-book reader 320 includes two housings, a housing 321 and a housing 322. The housing 321 and the housing 322 are combined with a hinge 325 so that the e-book reader 320 can be opened and closed with the hinge 325 as an axis. With such a structure, the e-book reader 320 can operate like a paper book.

A display portion 323 and a display portion 324 are incorporated in the housing 321 and the housing 322, respectively. The display portion 323 and the display portion 324 may display one image or different images. When the display portion 323 and the display portion 324 display different images, for example, text can be displayed on a display portion on the right side (the display portion 323 in FIG. 11C) and images can be displayed on a display portion on the left side (the display portion 324 in FIG. 11C). By applying the semiconductor device described in Embodiment 1 or 2, the e-book reader 320 can have high reliability.

FIG. 11C shows an example in which the housing 321 is provided with an operation portion and the like. For example, the housing 321 is provided with a power switch 326, operation keys 327, a speaker 328, and the like. With the operation key 327, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Further, the e-book reader 320 may have a function of an electronic dictionary.

The e-book reader 320 may send and receive data wirelessly. Through wireless communication, desired book data or the like can be purchased and downloaded from an electronic book server.

Figure 11D:
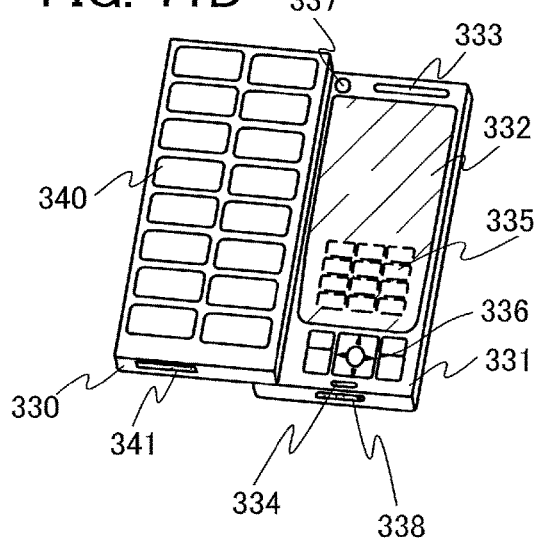

FIG. 11D illustrates a mobile phone, which includes two housings, a housing 330 and a housing 331. The housing 331 includes a display panel 332, a speaker 333, a microphone 334, a pointing device 336, a camera lens 337, an external connection terminal 338, and the like. In addition, the housing 330 includes a solar cell 340 having a function of charge of the portable information terminal, an external memory slot 341, and the like. Further, an antenna is incorporated in the housing 331. By applying the semiconductor device described in Embodiment 1 or 2, the mobile phone can have higher reliability.

Further, the display panel 332 is provided with a touch panel. A plurality of operation keys 335 which are displayed as images is illustrated by dashed lines in FIG. 11D. Note that the mobile phone includes a boosting circuit for raising a voltage output from the solar cell 340 to a voltage necessary for each circuit.

In the display panel 332, the display direction can be changed as appropriate depending on a usage pattern. Further, the mobile phone is provided with the camera lens 337 on the same surface as the display panel 332, and thus it can be used as a video phone. The speaker 333 and the microphone 334 can be used for videophone calls, recording and playing sound, and the like as well as voice calls. Further, the housings 330 and 331 in a state where they are opened as illustrated in FIG. 11D can be slid so that one overlaps the other; therefore, the size of the mobile phone can be reduced, which makes the mobile phone suitable for being carried.

The external connection terminal 338 can be connected to an AC adapter and various types of cables such as a USB cable, and charging and data communication with a personal computer or the like are possible. In addition, a larger amount of data can be stored by inserting a recording medium to the external memory slot 341 and can be moved.

Further, in addition to the above functions, an infrared communication function, a television reception function, or the like may be provided.

Figure 11E:
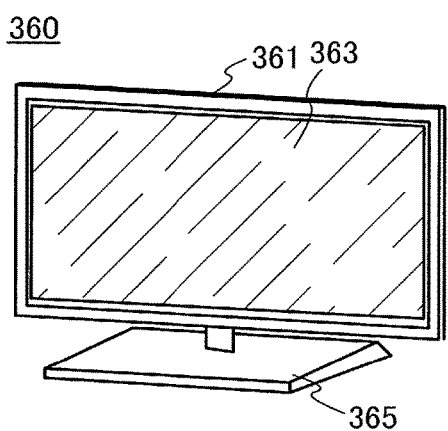

FIG. 11E shows an example of a television set. In a television set 360, a display portion 363 is incorporated in a housing 361. The display portion 363 can display images. Here, the housing 361 is supported by a stand 365. By applying the semiconductor device 360 described in Embodiment 1 or 2, the television set 360 can have high reliability.

The television set 360 can be operated by an operation switch of the housing 361 or a separate remote controller. Further, the remote controller may be provided with a display portion for displaying data output from the remote controller.

Note that the television set 360 is provided with a receiver, a modem, and the like. With the use of the receiver, general television broadcasting can be received. Furthermore, when the display device is connected to a communication network with or without wires via the modem, one-way (from a sender to a receiver) or two-way (between a sender and a receiver or between receivers) information communication can be performed.

The structures, the methods, and the like described in this embodiment may be combined as appropriate with any of the structures, the methods, and the like described in the other embodiments.

Example 1

In this example, hydrogen diffused into an oxide semiconductor layer from a substrate through a base insulating layer will be described.

In this example, hydrogen concentrations of a glass substrate, a base insulating layer over the glass substrate, and an oxide semiconductor layer over the base insulating layer in a depth direction were analyzed by secondary ion mass spectrometry (SIMS).

In this example, hydrogen concentrations in a depth direction were analyzed when the mass numbers of samples 4 to 7 were each 1.

A method for manufacturing the sample 4 is described here.

First, a first silicon oxide layer was formed over the glass substrate. The first silicon oxide layer corresponds to the base insulating layer in this specification. Note that the film formation conditions of the first silicon oxide layer were as follows.

Film formation method: RF sputtering method
Target: quartz target
Film formation gas: Ar (25 sccm), $O_2$ (25 sccm)
Electric power: 1.5 kW (13.56 MHz)
Pressure: 0.4 Pa
T-S distance: 60 mm
Substrate temperature in film formation: 100° C.
Thickness: 300 nm Next, the oxide semiconductor layer was formed over the first silicon oxide layer.

The film formation conditions of the oxide semiconductor layer were as follows.

Film formation method: DC sputtering method
Target: In—Ga—Zn—O ($In_2O_3$:$Ga_2O_3$:ZnO=1:1:2 [molar ratio]) target
Film formation gas: Ar (30 sccm), $O_2$ (15 sccm)
Electric power: 0.5 kW (DC)
Pressure: 0.4 Pa
T-S distance: 60 mm
Substrate temperature in film formation: 200° C.
Thickness: 100 nm Next, a second silicon oxide layer was formed over the oxide semiconductor layer. Note that the film formation conditions of the second silicon oxide layer were as follows.

Film formation method: RF sputtering method
Target: quartz target
Film formation gas: Ar (25 sccm), $O_2$ (25 sccm)
Electric power: 1.5 kW (13.56 MHz)
Pressure: 0.4 Pa
T-S distance: 60 mm
Substrate temperature in film formation: 100° C.
Thickness: 100 nm Note that through the step of forming the first silicon oxide layer to the step of forming the second silicon oxide layer, the steps were successively performed in vacuum. As described above, the sample 4 was completed.

Next, the sample 5 is described. The description of the sample 4 is to be referred to for the film formation method of each layer.

First, first heat treatment was performed on a glass substrate over which a first silicon oxide layer was not formed yet. The first heat treatment was performed at a substrate temperature of 400° C. in vacuum of $1\times10^{-5}$ Pa for 10 minutes.

Next, after the first heat treatment, the first silicon oxide layer was formed.

Next, an oxide semiconductor layer was formed over the first silicon oxide layer.

Next, a second silicon oxide layer was formed over the oxide semiconductor layer.

Note that through the step of performing the first heat treatment to the step of forming the second silicon oxide layer, the steps were successively performed in vacuum. As described above, the sample 5 was completed.

Here, the sample 6 and the sample 7 were obtained by performing second heat treatment on the sample 4 and the sample 5, respectively. The second heat treatment was performed at 450° C. under a nitrogen atmosphere for an hour.

Table 1 shows whether the first heat treatment and the second heat treatment are performed on the samples 4 to 7.

TABLE 1

| Sample | First heat treatment | Second heat treatment |
|---|---|---|
| Sample 4 | Not performed | Not performed |
| Sample 5 | Performed | Not performed |
| Sample 6 | Not performed | Performed |
| Sample 7 | Performed | Performed |

SIMS results of the sample 4, the sample 5, the sample 6, and the sample 7 are shown in FIG. 15, FIG. 16, FIG. 17, and FIG. 18, respectively.

Figure 15:
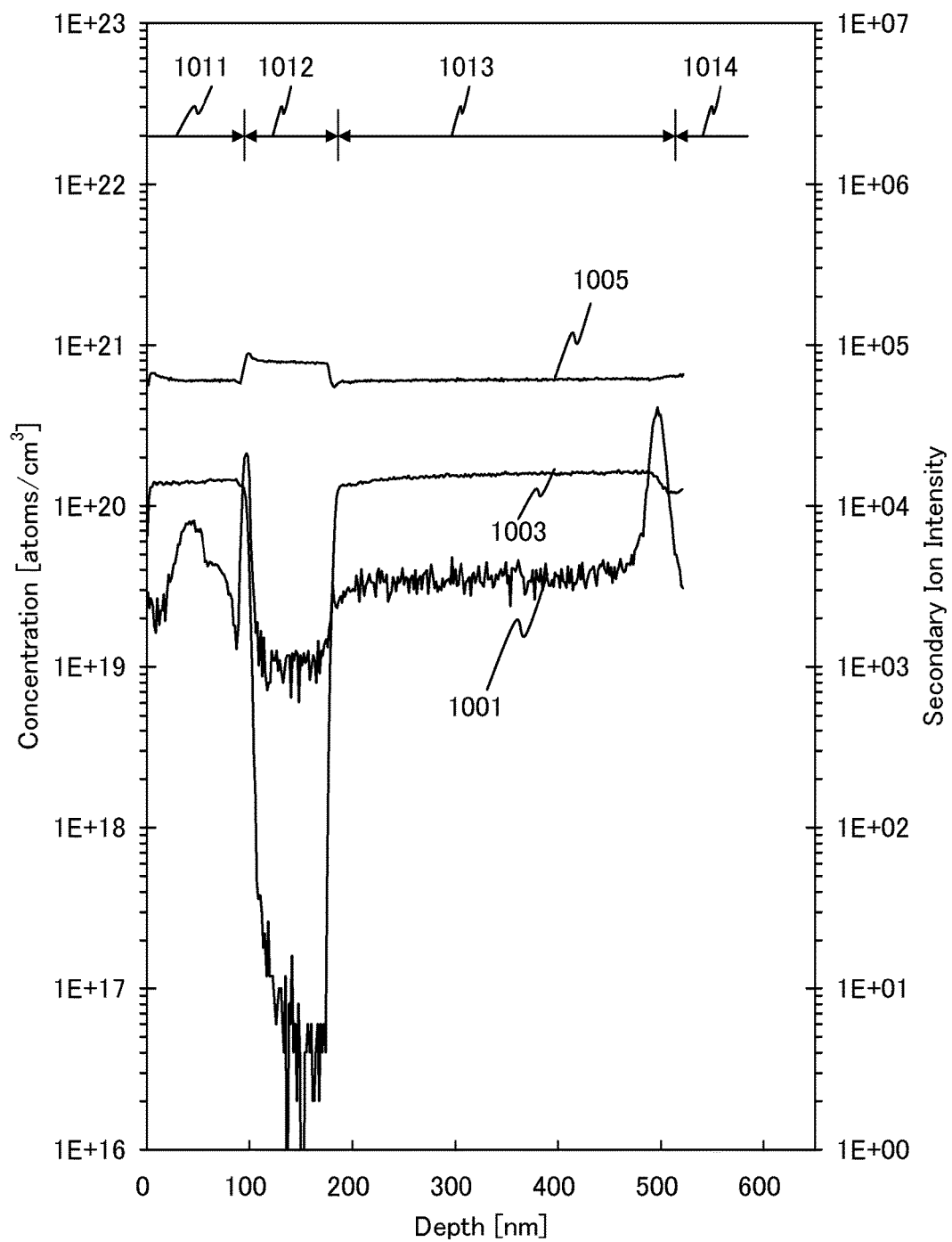
FIG. 15 is a graph showing a result of performing secondary ion mass spectrometry analysis on a sample manufactured in Example.

FIG. 15 shows an SIMS result of the sample 4. A solid line 1001 shows a hydrogen concentration when the mass number of the sample 4 was 1, a solid line 1003 shows secondary ion intensity of silicon when the mass number of the sample 4 was 30, and a solid line 1005 shows secondary ion intensity of oxygen when the mass number of the sample 4 was 16.

Figure 16:
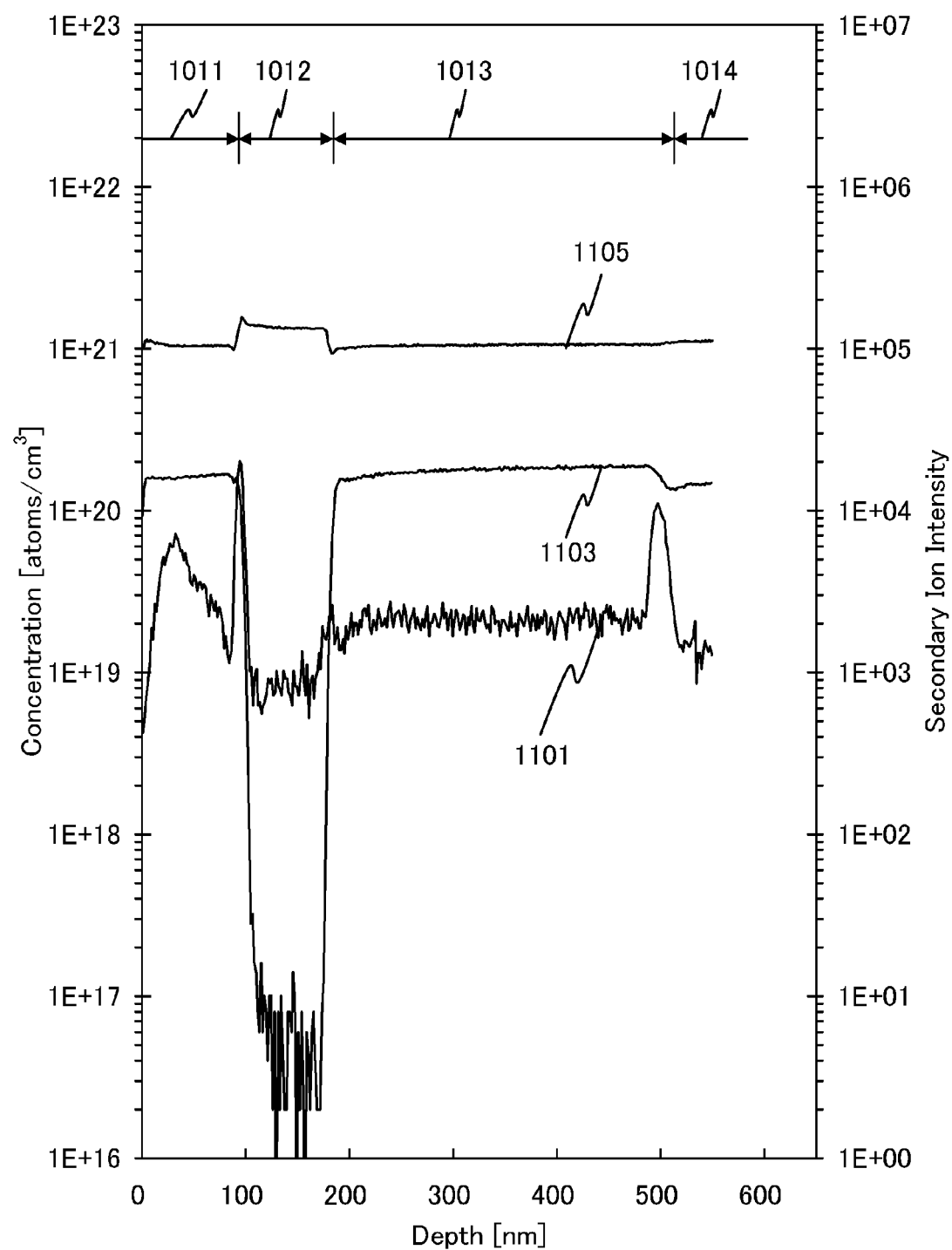
FIG. 16 is a graph showing a result of performing secondary ion mass spectrometry analysis on a sample manufactured in Example.

FIG. 16 shows an SIMS result of the sample 5. A solid line 1101 shows a hydrogen concentration when the mass number of the sample 5 was 1, a solid line 1103 shows secondary ion intensity of silicon when the mass number of the sample 5 was 30, and a solid line 1105 shows secondary ion intensity of oxygen when the mass number of the sample 5 was 16.

Figure 17:
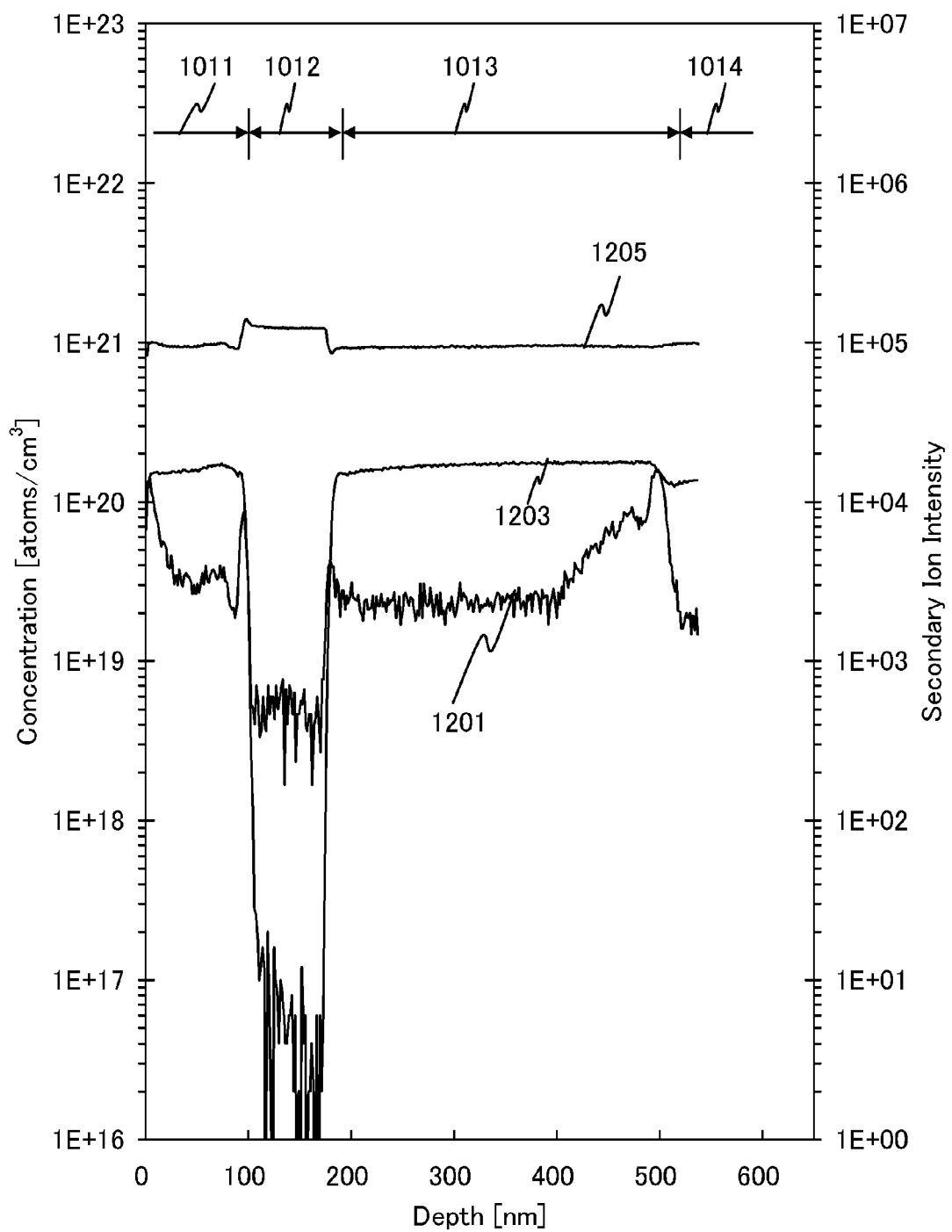
FIG. 17 is a graph showing a result of performing secondary ion mass spectrometry analysis on a sample manufactured in Example.

FIG. 17 shows an SIMS result of the sample 6. A solid line 1201 shows a hydrogen concentration when the mass number of the sample 6 was 1, a solid line 1203 shows secondary ion intensity of silicon when the mass number of the sample 6 was 30, and a solid line 1205 shows secondary ion intensity of oxygen when the mass number of the sample 6 was 16.

Figure 18:
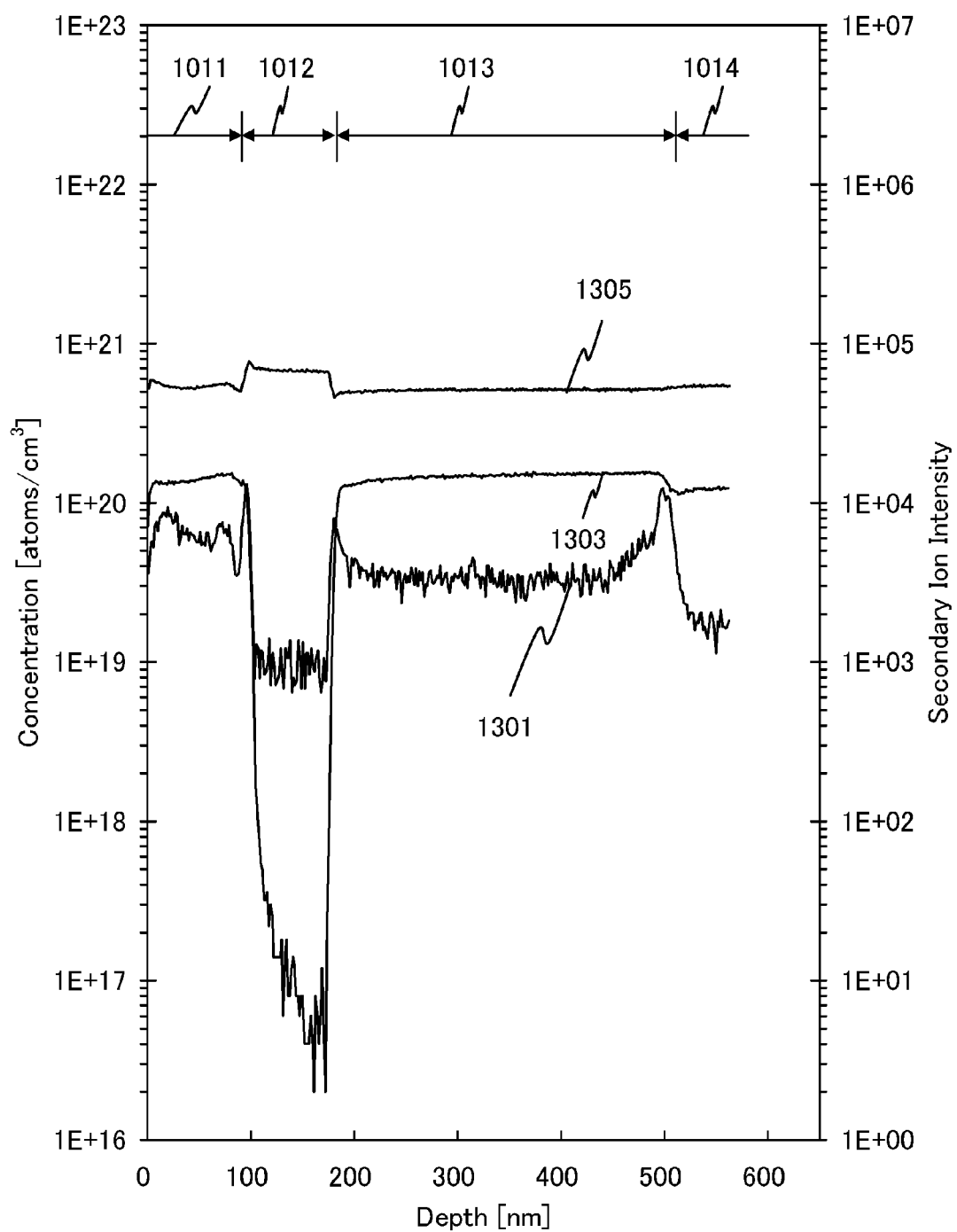
FIG. 18 is a graph showing a result of performing secondary ion mass spectrometry analysis on a sample manufactured in Example.

FIG. 18 shows an SIMS result of the sample 7. A solid line 1301 shows a hydrogen concentration when the mass number of the sample 7 was 1, a solid line 1303 shows secondary ion intensity of silicon when the mass number of the sample 7 was 30, and a solid line 1305 shows secondary ion intensity of oxygen when the mass number of the sample 7 was 16.

Note that a range 1011 shows the second silicon oxide layer; a range 1012, the oxide semiconductor layer; a range 1013, the first silicon oxide layer; and a range 1014, the glass substrate. Here, a standard sample of silicon oxide was used to quantify a hydrogen concentration; therefore, the quantitative hydrogen concentration when the mass number was 1 is in the range 1011 and the range 1013.

When the sample 4 and the sample 5 were compared to each other, it was found that there was a peak of a hydrogen concentration in the first silicon oxide layer near the glass substrate in each sample. In the sample 4 and the sample 5, the hydrogen concentrations at the respective peaks were $3.7 \times 10^{20}$ atoms/cm$^3$ and $1.1 \times 10^{20}$ atoms/cm$^3$, respectively.

When the sample 4 and the sample 6 are compared to each other, it is found that there is a region having a high hydrogen concentration in the first silicon oxide layer in a depth range of 500 nm to 400 nm. This is caused due to diffusion of hydrogen by the second heat treatment.

In a similar manner, when the sample 5 and the sample 7 are compared to each other, it is found that there is a region having a high hydrogen concentration in the first silicon oxide layer in a depth range of 500 nm to 450 nm.

It is found that the amount of hydrogen diffused in the first silicon oxide layer of the sample 7 is less than that in the sample 6.

Further, an advantageous effect of reducing the amount of hydrogen diffused in the first silicon oxide layer can be reduced also by thickly forming the first silicon oxide layer.

It is found from this embodiment that the adverse effect caused by diffusion of hydrogen into the oxide semiconductor layer by the second heat treatment can be reduced by reducing the amount of hydrogen that exists on the substrate surface in advance by the first heat treatment.

Example 2

In this example, a method for manufacturing the transistor including an oxide semiconductor layer, which is illustrated in FIGS. 1A to 1C, and the characteristics will be described. In this example, samples 1 to 3 were manufactured and the respective characteristics were measured.

As a substrate, a glass substrate was used.

First heat treatment was performed on the glass substrate. The first heat treatment was performed at a substrate temperature of 400° C. in vacuum of $1 \times 10^{-5}$ Pa for 10 minutes.

After that, a base insulating layer and an oxide semiconductor layer were successively formed in vacuum.

The film formation conditions of the base insulating layer were as follows.

Film formation method: RF sputtering method
Target: quartz target
Film formation gas: Ar (25 sccm), O$_2$ (25 sccm)
Electric power: 1.5 kW (13.56 MHz)
Pressure: 0.4 Pa
T-S distance: 60 mm
Substrate temperature in film formation: 100° C.
Thickness: 300 nm The film formation conditions of the oxide semiconductor layer were as follows.

Film formation method: DC sputtering method
Target: In—Ga—Zn—O (In$_2$O$_3$:Ga$_2$O$_3$:ZnO=1:1:2 [molar ratio]) target
Film formation gas: Ar (30 sccm), O$_2$ (15 sccm)
Electric power: 0.5 kW (DC)
Pressure: 0.4 Pa
T-S distance: 60 mm
Substrate temperature in film formation: 200° C.
Thickness: 30 nm Next, an oxide semiconductor layer having an island shape is formed by processing the oxide semiconductor layer.

Next, a tungsten layer which was a conductive layer was formed with a thickness of 100 nm by a DC sputtering method, and a source electrode and a drain electrode were formed by processing the tungsten layer.

Next, a silicon oxynitride layer was formed as a gate insulating layer with a thickness of 15 nm by a plasma CVD method.

Next, a tantalum nitride layer and a tungsten layer which were conductive layers were formed with thicknesses of 15 nm and 135 nm, respectively, by a DC sputtering method, and a gate electrode was formed by processing the tantalum nitride layer and the tungsten layer.

Then, second heat treatment was performed. The second heat treatment was performed at a temperature of 250° C., 300° C., or 350° C. under a nitrogen gas atmosphere for an hour. At this time, the heating temperatures of the sample 1, the sample 2, and the sample 3 were set to 250° C., 300° C., and 350° C., respectively.

Through the above process, the transistor of this example can be manufactured.

FIGS. 12A and 12B, FIGS. 13A and 13B, and FIGS. 14A and 14B show drain current (Ids)-gate voltage (Vgs) measurement results in the transistors of this example. The measurement results of the 25 points are all shown. The channel lengths L are 0.8 μm and 3 μm, and the channel width W is 10 μm. Note that the voltage Vds between the source electrode and the drain electrode of the transistor was set to 3 V.

Figure 12A:
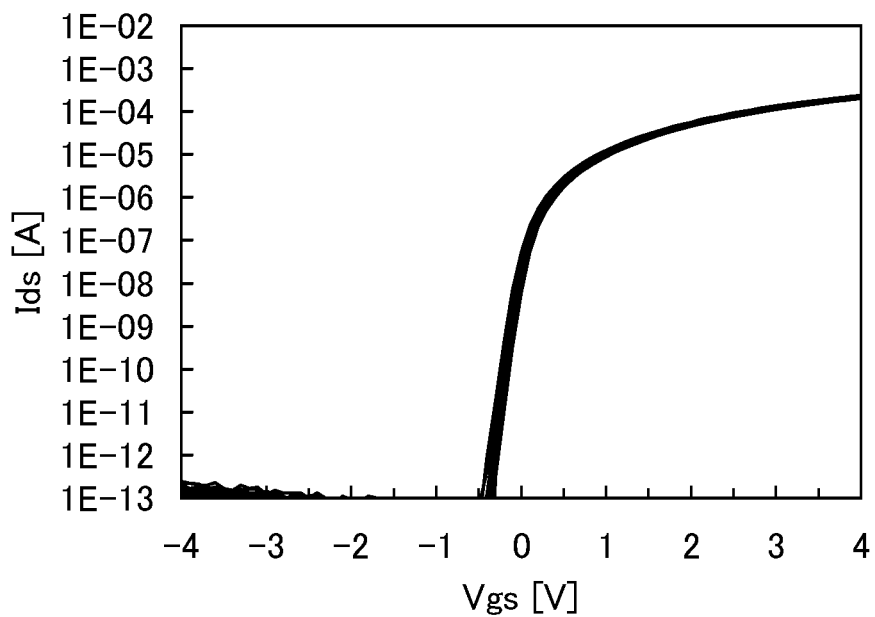
FIGS. 12A and 12B are graphs each showing electric characteristics of a semiconductor device manufactured using one embodiment of the present invention.
Figure 12B:
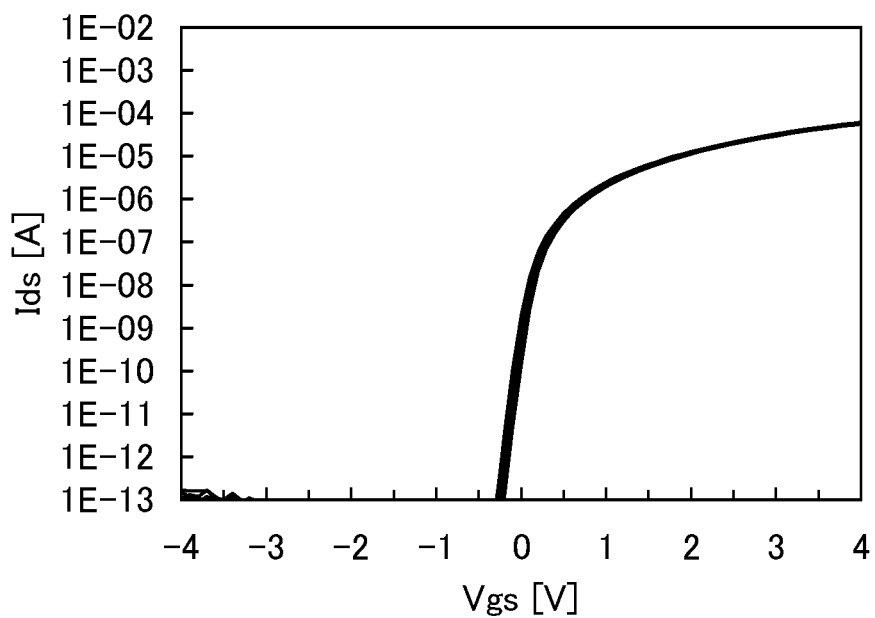
Figure 13A:
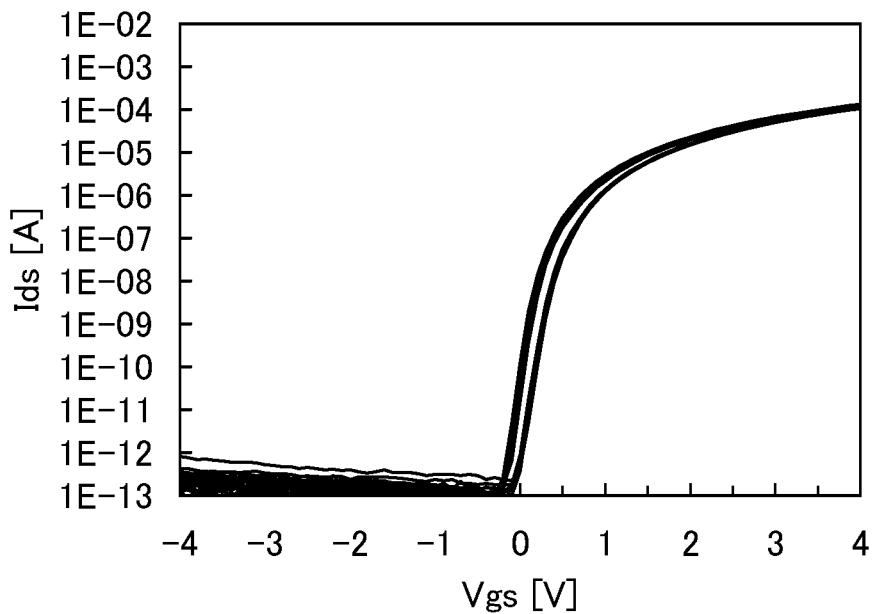
FIGS. 13A and 13B are graphs each showing electric characteristics of a semiconductor device manufactured using one embodiment of the present invention.
Figure 13B:
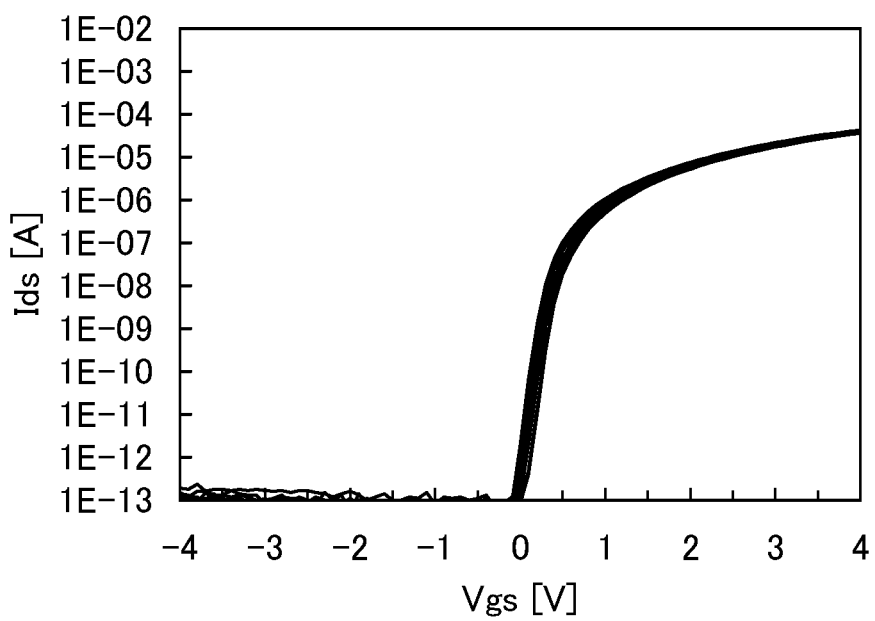
Figure 14A:
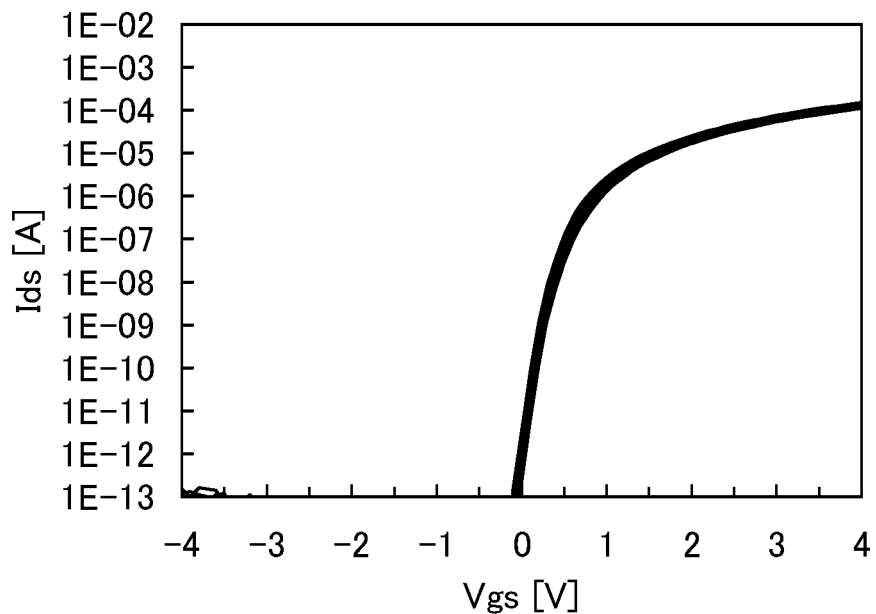
FIGS. 14A and 14B are graphs each showing electric characteristics of a semiconductor device manufactured using one embodiment of the present invention.
Figure 14B:
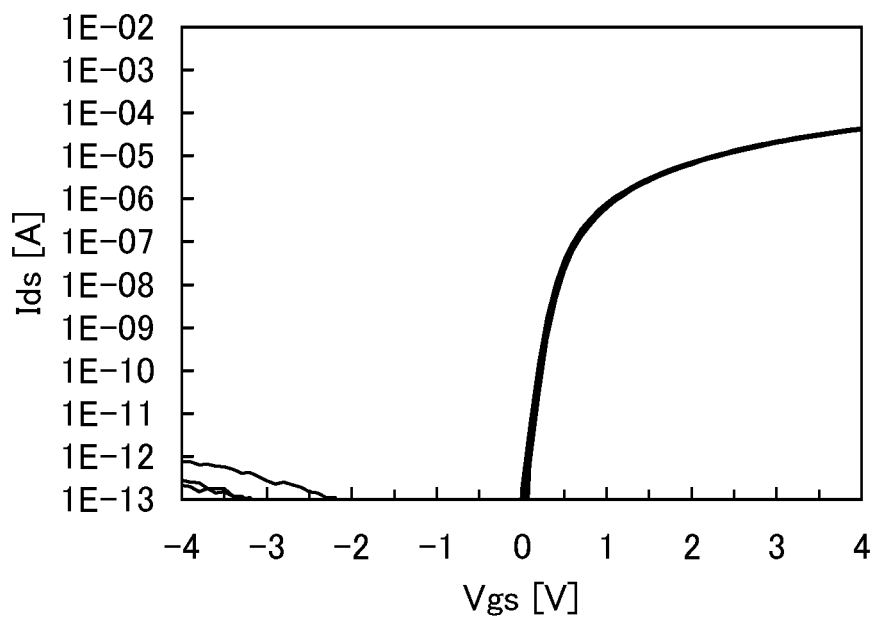

FIGS. 12A and 12B are Ids-Vgs measurement results of the sample 1. FIG. 12A is a measurement result of a transistor whose channel length L was 0.8 μM, and FIG. 12B is a measurement result of a transistor whose channel length L was 3 μm. FIGS. 13A and 13B are Ids-Vgs measurement results of the sample 2. FIG. 13A is a measurement result of a transistor whose channel length L was 0.8 μM, and FIG. 13B is a measurement result of a transistor whose channel length L was 3 μm. FIGS. 14A and 14B are Ids-Vgs measurement results of the sample 3. FIG. 14A is a measurement result of a transistor whose channel length L was 0.8 μm, and FIG. 14B is a measurement result of a transistor whose channel length L was 3 μm.

Table 2 shows characteristics of each transistor obtained from FIGS. 12A and 12B, FIGS. 13A and 13B, and FIGS. 14A and 14B. Table 2 shows a threshold voltage and a current value when Vgs is set to 0 V.

TABLE 2

| Sample | Channel length L [μm] | Second heat treatment temperature [° C.] | Threshold voltage [V] | Current value (Vgs = 0 V) [A] |
|---|---|---|---|---|
| Sample 1 | 0.8 | 250 | 0.22 | 1.7E−08 |
| Sample 2 | 0.8 | 300 | 0.70 | 4.8E−11 |
| Sample 3 | 0.8 | 350 | 0.72 | 1.2E−12 |
| Sample 1 | 3 | 250 | 0.40 | 8.1E−10 |
| Sample 2 | 3 | 300 | 0.68 | 9.7E−13 |
| Sample 3 | 3 | 350 | 0.71 | 1.0E−13 or less |

From Table 2, the threshold voltage of the sample 3 was higher than that of the sample 2, and the threshold voltage of the sample 2 was higher than that of the sample 1. This tendency was remarkable in the case where a channel length L is shorter.

Further, from Table 2, the current value of the sample 1 when Vgs was set to 0 V was higher than that of the sample 2, and the current value of the sample 2 when Vgs was set to 0 V was higher than that of the sample 3. In particular, in the result of the sample 3 whose channel length was 3 μm, the current value was less than or equal to $1.0 \times 10^{-13}$ A, which was extremely small. This tendency was remarkable in the case where a channel length L is shorter.

In such a manner, in this example, it was possible to obtain a transistor which has normally-off characteristics and an extremely small current value when Vgs was set to 0 V.

Example 3

In this example, oxygen diffused into an oxide semiconductor layer from a base insulating layer will be described.

Note that $^{18}O$ is contained in a base insulating layer in order to evaluate diffusion of oxygen into an oxide semiconductor layer. Note that $^{18}O$, which is one of stable isotopes of oxygen, is oxygen the mass number of which is 18 and exists also naturally in a degree of approximately 0.2%. In this example, $^{18}O$ is used only when specified.

In this example, in samples 8 to 11, $^{18}O$ in a depth direction was analyzed by SIMS.

A method for manufacturing each sample is described here.

First, a silicon oxide layer was formed over a quartz substrate as a base insulating layer. The film formation conditions of the oxide semiconductor layer were as follows.
Film formation method: RF sputtering method
Target: quartz target
Film formation gas: Ar (25 sccm), $O_2$ (25 sccm)
Electric power: 1.5 kW (13.56 MHz)
Pressure: 0.4 Pa
T-S distance: 60 mm
Substrate temperature in film formation: 100° C.
Thickness: 300 nm
However, $^{18}O$ was used for oxygen which was a film formation gas.

Next, an oxide semiconductor layer was formed over the silicon oxide layer.

The film formation conditions of the oxide semiconductor layer were as follows.
Film formation method: DC sputtering method
Target: In—Ga—Zn—O ($In_2O_3$:$Ga_2O_3$:$ZnO$=1:1:2 [molar ratio]) target
Film formation gas: Ar (30 sccm), $O_2$ (15 sccm)
Electric power: 0.5 kW (DC)
Pressure: 0.4 Pa
T-S distance: 60 mm
Substrate temperature in film formation: 200° C.
Thickness: 100 nm Then, heat treatment is performed. The heat treatment was performed at a temperature of 450° C., 550° C., or 650° C. under a nitrogen atmosphere for an hour. Here, the heating was not performed on the sample 8; and the heating temperatures of the sample 9, the sample 10, and the sample 11 were set to 450° C., 550° C., and 650° C., respectively.

Figure 19:
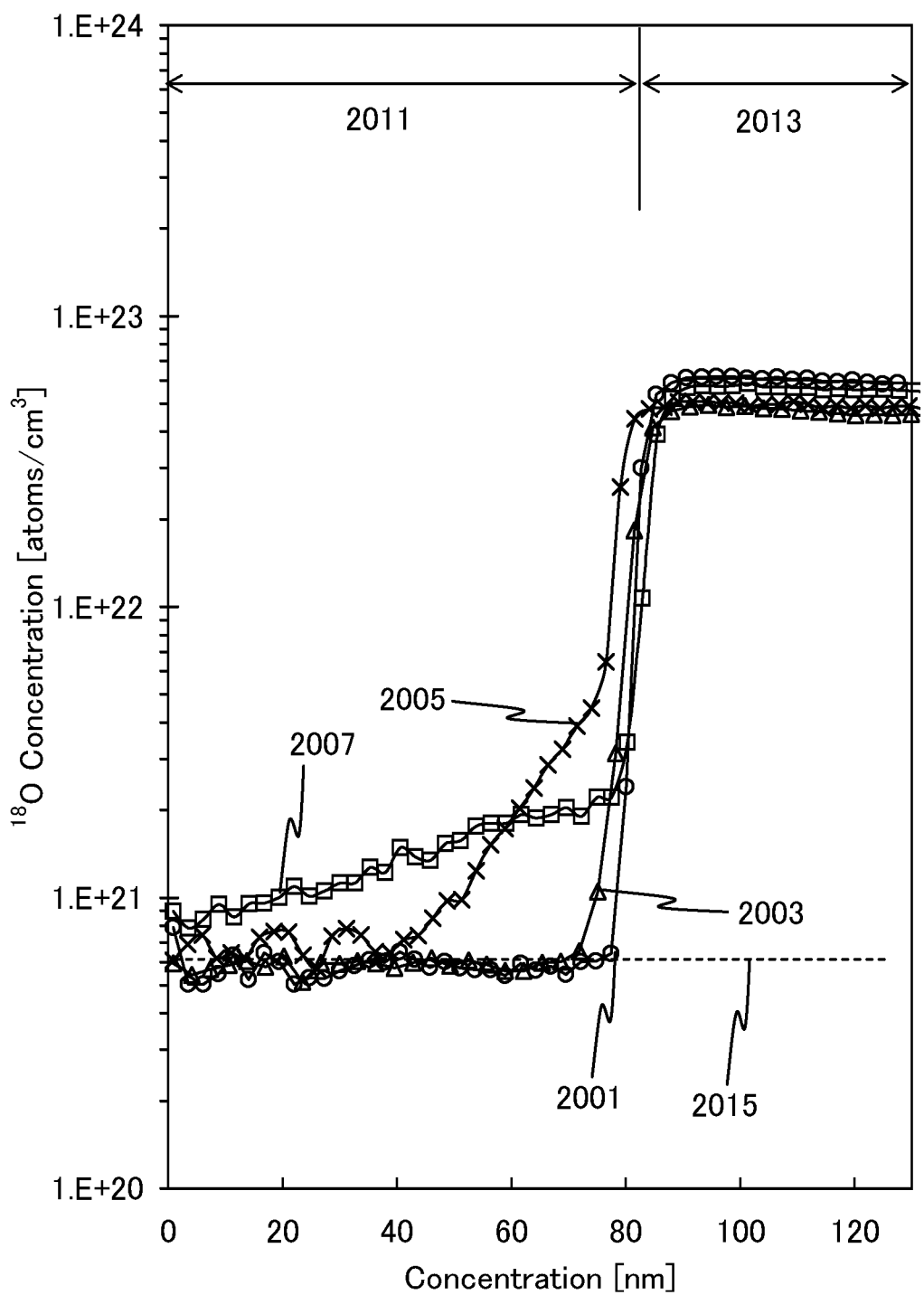
FIG. 19 is a graph showing diffusion of oxygen in a sample manufactured in Example.

FIG. 19 shows results of analyzing $^{18}O$ of the samples 8 to 11 in a depth direction. A symbol 2001, a symbol 2003, a symbol 2005, and a symbol 2007 show the sample 8, the sample 9, the sample 10, and the sample 11, respectively. In addition, a range 2011 shows the oxide semiconductor layer, and a range 2013 shows the silicon oxide layer. Here, the quantitative oxygen whose mass number is 18 is in the range 2011. Note that a dashed line 2015 shows a quantitative lower limit of $^{18}O$ in the oxide semiconductor layer.

It was found that $^{18}O$ was hardly diffused into the oxide semiconductor layer in the sample 8. Further, it was found that a distance in which $^{18}O$ was diffused into the oxide semiconductor layer was extended as the temperatures for the heat treatment of the samples 9 to 11 were sequentially increased.

Here, a diffusion coefficient was estimated assuming that a surface concentration of $^{18}O$ in the silicon oxide layer, which was a diffusion source of $^{18}O$, was constant; and a concentration of $^{18}O$ in infinity was zero. With the above assumption, the concentration distribution of $^{18}O$ in a depth direction can be expressed by Formula 1 shown below.

$$C(x, t) = C_S \cdot erfc\left(\frac{x}{2\sqrt{Dt}}\right) \quad \text{[FORMULA 1]}$$

Here, $C_S$ denotes a surface concentration of $^{18}O$ in the oxide semiconductor layer; x, a distance from the surface (here, a distance between the oxide semiconductor layer and an interface between the silicon oxide layer and the oxide semiconductor layer); D, a diffusion coefficient of $^{18}O$ in the oxide semiconductor layer; and t, a time.

Figure 20:
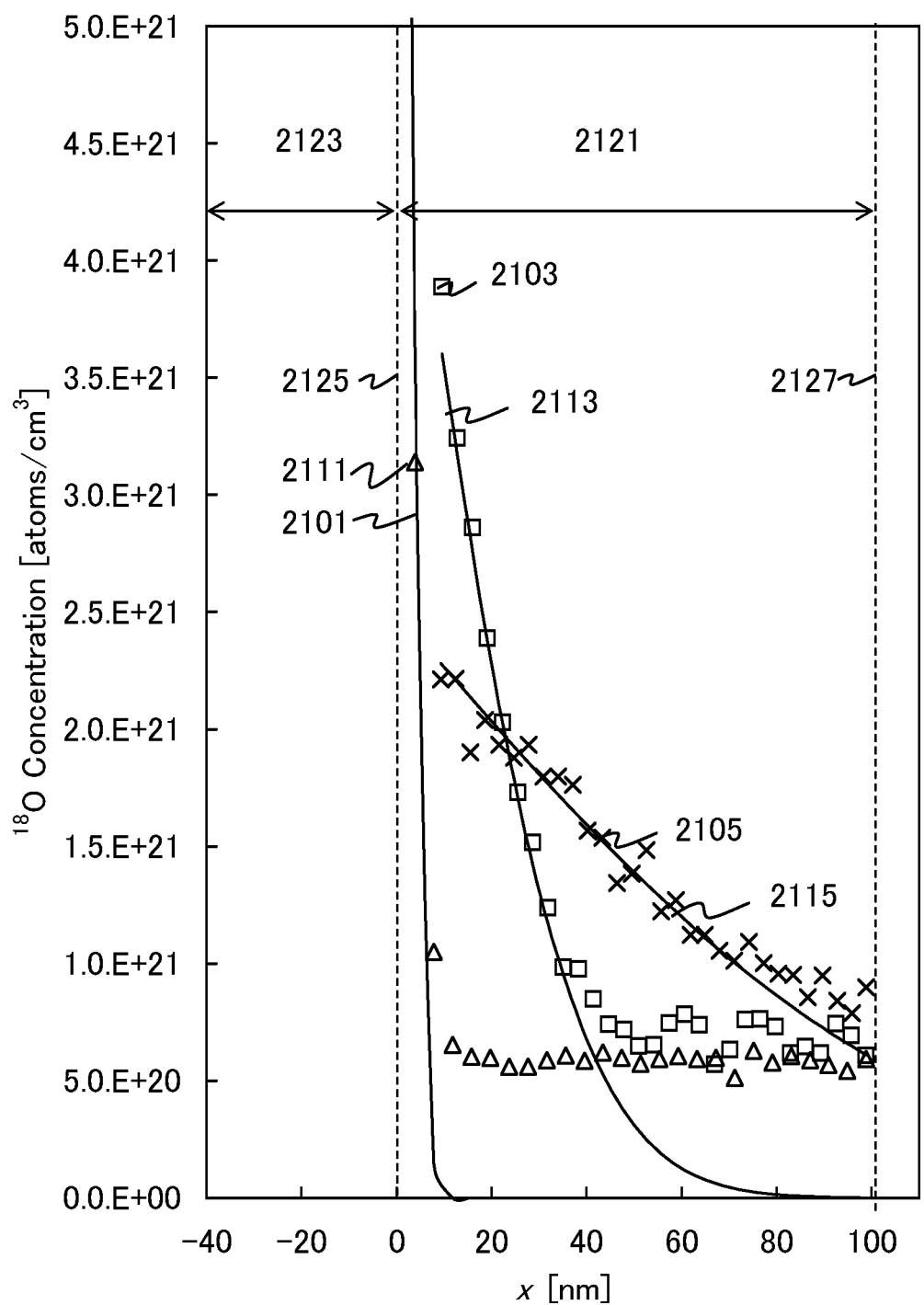
FIG. 20 is a graph for analyzing diffusion of oxygen in a sample manufactured in Example.

FIG. 20 shows results of fitting which was performed with Formula 1. A symbol 2101, a symbol 2103, and a symbol 2105 show concentration distributions of $^{18}O$ in the sample 9, the sample 10, and the sample 11, respectively. In addition, a solid line 2111, a solid line 2113, and a solid line 2115 show fitting curves of the sample 9, the sample 10, and the sample 11, respectively. Here, a range 2121 shows the oxide semiconductor layer, and a range 2123 shows the silicon oxide layer. Here, the quantitative $^{18}O$ is in the range 2121. Note that a dashed line 2125 shows an interface between the silicon oxide layer and the oxide semiconductor layer, and a dashed line 2127 shows a surface of the oxide semiconductor layer. Note that fitting is not performed on the sample 8 because diffusion was not confirmed from FIG. 19.

From the fitting results of FIG. 20, the diffusion coefficient of $^{18}O$ in the sample 9 was $1.2 \times 10^{-17}$ cm²/second, the diffusion coefficient of $^{18}O$ in the sample 10 was $1.0 \times 10^{-15}$ cm²/second, and the diffusion coefficient of $^{18}O$ in the sample 11 was $1.0 \times 10^{-14}$ cm²/second.

Here, the diffusion coefficient D of $^{18}O$ at the temperature T of the oxide semiconductor layer can be expressed by Formula 2.

$$D = D_0 \cdot \exp\left(\frac{-E_a}{kT}\right) \quad \text{[FORMULA 2]}$$

$D_0$ denotes a frequency factor; $E_a$, an activation energy; and k, Boltzmann constant.

By taking natural logarithms of both sides of Formula 2, Formula 3 can be given.

$$\ln D = \ln D_0 - \frac{E_a}{k} \cdot \frac{1}{T} \quad \text{[FORMULA 3]}$$

In other words, a slope of a straight line in which lnD is plotted with respect to the reciprocal of T is denoted by $-(E_a/k)$ and a tangent is denoted by $\ln D_0$.

Figure 21:
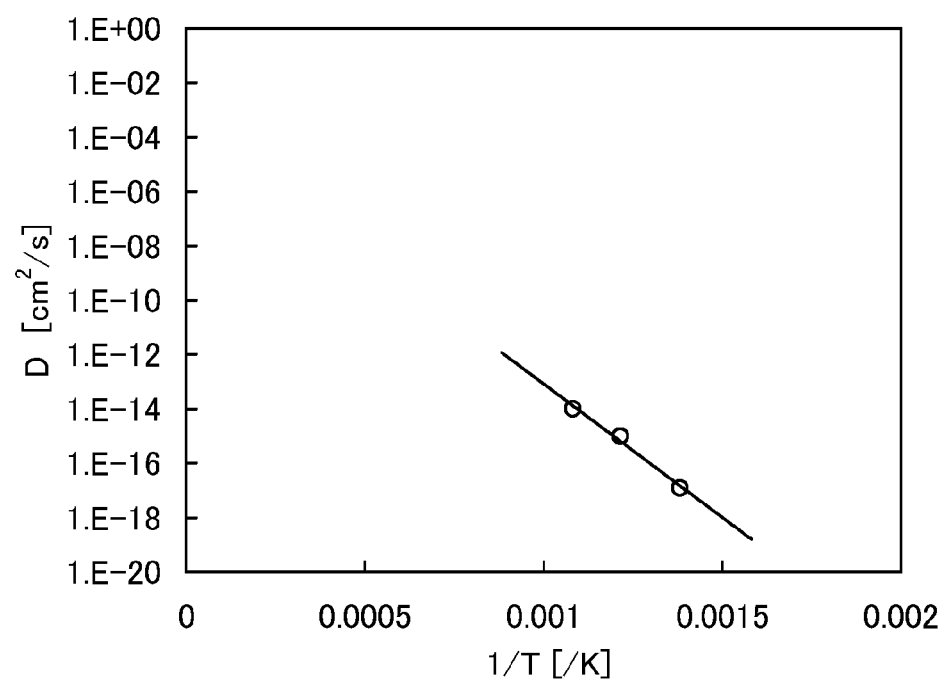
FIG. 21 is a graph for deriving activation energy from a diffusion coefficient of oxygen in a sample manufactured in Example.

Here, the natural logarithms of D and the reciprocals of T in the samples 9 to 11, which were obtained from FIG. 20, are plotted and shown in FIG. 21. When the plots of FIG. 21 are approximated, $\ln D_0$ and $-(E_a/k)$ were obtained to be $-7.4864$ and $-22624$, respectively. In other words, $D_0$ was $5.607 \times 10^{-4}$ cm²/second. Further, since k is $1.3807 \times 10^{-23}$ J/K, $E_a$ is $3.124 \times 10^{-19}$ J. When $E_a$ is converted into a unit, 1.95 eV can be obtained.

Through this example, it was possible to confirm diffusion of oxygen from the silicon oxide layer into the oxide semiconductor layer.

Further, it was found that more oxygen was diffused from the silicon oxide layer into the oxide semiconductor layer as the temperature of heat treatment was increased and therefore it was possible to reduce the interface state between the oxide semiconductor layer and the silicon oxide layer and oxygen deficiency in the oxide semiconductor layer.

EXPLANATION OF REFERENCE

100: substrate, 102: base insulating layer, 104: oxide semiconductor layer, 106: oxide semiconductor layer, 108*a*: source electrode, 108*b*: drain electrode, 112: gate insulating layer, 114: gate electrode, 116*a*: wiring, 116*b*: wiring, 122*a*: source region, 122*b*: drain region, 124: interlayer insulating layer, 126: channel region, 130*a*: contact hole, 130*b*: contact hole, 151: transistor, 152: transistor, 153: transistor, 201: first substrate, 202: pixel portion, 203: signal line driver circuit, 204: scan line driver circuit, 205: sealant, 206: second substrate, 208: liquid crystal layer, 210: transistor, 211: transistor, 213: liquid crystal element, 215: connection terminal electrode, 216: terminal electrode, 218: FPC, 218*a*: FPC, 218*b*: FPC, 219: anisotropic conductive layer, 221: insulating layer, 230: first electrode, 231: second electrode, 232: insulating layer, 233: insulating layer, 235: spacer, 240: partition wall, 241: electroluminescent layer, 243: light-emitting element, 244: filler, 252: cavity, 253: spherical particle, 254: filler, 255*a*: black region, 255*b*: white region, 301: main body, 302: housing, 303: display portion, 304: keyboard, 311: main body, 312: stylus, 313: display portion, 314: operation button, 315: external interface, 320: e-book reader, 321: housing, 322: housing, 323: display portion, 324: display portion, 325: hinge, 326: power switch, 327: operation key, 328: speaker, 330: housing, 331: housing, 332: display panel, 333: speaker, 334: microphone, 335: operation key, 336: pointing device, 337: camera lens, 338: external connection terminal, 340: solar cell, 341: external memory slot, 360: television set, 361: housing, 363: display portion, 365: stand, 1001: solid line, 1003: solid line, 1005: solid line, 1011: range, 1012: range, 1013: range, 1014: range, 1101: solid line, 1103: solid line, 1105: solid line, 1201: solid line, 1203: solid line, 1205: solid line, 1301: solid line, 1303: solid line, 1305: solid line, 2001: symbol, 2003: symbol, 2005: symbol, 2007: symbol, 2011: range, 2013: range, 2015: dashed line, 2101: symbol, 2103: symbol, 2105: symbol, 2111: solid line, 2113: solid line, 2115: solid line, 2121: range, 2123: range, 2125: dashed line, and 2127: dashed line.

This application is based on Japanese Patent Application serial No. 2010-168404 filed with the Japan Patent Office on Jul. 27, 2010, the entire contents of which are hereby incorporated by reference.

The invention claimed is:

1. A method for manufacturing a semiconductor device comprising: performing a first heat treatment on a substrate; forming an insulating layer, in which the number of oxygen atoms per unit volume is more than twice the number of silicon atoms per unit volume, over and in direct contact with the substrate; forming an oxide semiconductor layer over the insulating layer; performing a second heat treatment after forming the oxide semiconductor layer; forming a gate insulating layer over the oxide semiconductor layer; and forming a gate electrode over the gate insulating layer, wherein a hydrogen concentration in the insulating layer is less than or equal to $1.1 \times 10^{20}$ atoms/cm³¹ and wherein the first heat treatment is performed before forming the insulating layer.

2. The method for manufacturing a semiconductor device according to claim 1, wherein the steps of performing the first heat treatment, forming the insulating layer, and forming the oxide semiconductor layer are performed without exposure to air.

3. The method for manufacturing a semiconductor device according to claim 1, wherein a temperature of the first heat treatment is higher than or equal to 100° C. and lower than a strain point of the substrate.

4. The method for manufacturing a semiconductor device according to claim 1, wherein a temperature of the second heat treatment is higher than or equal to 150° C. and lower than a strain point of the substrate.

5. The method for manufacturing a semiconductor device according to claim 1, further comprising a step of:
forming a source electrode and a drain electrode over the oxide semiconductor layer.

6. The method for manufacturing a semiconductor device according to claim 1,
wherein a temperature of the first heat treatment is higher than or equal to 300° C. and lower than or equal to 600° C.

7. A method for manufacturing a semiconductor device comprising: performing a first heat treatment on an exposed surface of a substrate; forming an insulating layer, in which the number of oxygen atoms per unit volume is more than twice the number of silicon atoms per unit volume, over and in direct contact with the exposed surface of the substrate after performing the first heat treatment; forming an oxide semiconductor layer over the insulating layer; performing a second heat treatment after forming the oxide semiconductor layer; forming a gate insulating layer over the oxide semiconductor layer; and forming a gate electrode over the gate insulating layer, wherein a hydrogen concentration in the insulating layer is less than or equal to $1.1 \times 10^{20}$ atoms/cm$^3$.

8. The method for manufacturing a semiconductor device according to claim 7, wherein the steps of performing the first heat treatment, forming the insulating layer, and forming the oxide semiconductor layer are performed without exposure to air.

9. The method for manufacturing a semiconductor device according to claim 7, wherein a temperature of the first heat treatment is higher than or equal to 100° C. and lower than a strain point of the substrate.

10. The method for manufacturing a semiconductor device according to claim 7, wherein the steps of performing the first heat treatment, forming the insulating layer, and forming the oxide semiconductor layer are performed in vacuum.

11. The method for manufacturing a semiconductor device according to claim 7, wherein, in the insulating layer, a released amount of oxygen by heating, which is converted to an oxygen atom, is greater than or equal to $1.0 \times 10^{18}$ atoms/cm$^3$ in thermal desorption spectroscopy.

12. The semiconductor device according to claim 7, wherein the insulating layer is silicon oxide.

13. The method for manufacturing a semiconductor device according to claim 7, wherein a temperature of the second heat treatment is higher than or equal to 150° C. and lower than a strain point of the substrate.

14. The method for manufacturing a semiconductor device according to claim 7,
wherein the insulating layer includes a first region adjacent to the substrate, and
wherein a hydrogen concentration in the first region is less than or equal to $1.1 \times 10^{20}$ atoms/cm$^3$.

15. The method for manufacturing a semiconductor device according to claim 7, further comprising a step of:
forming a source electrode and a drain electrode over the oxide semiconductor layer.

16. The method for manufacturing a semiconductor device according to claim 7,
wherein a temperature of the first heat treatment is higher than or equal to 300° C. and lower than or equal to 600° C.

* * * * *